US006954001B2

(12) United States Patent
Nakamura et al.

(10) Patent No.: US 6,954,001 B2
(45) Date of Patent: Oct. 11, 2005

(54) SEMICONDUCTOR DEVICE INCLUDING A DIFFUSION LAYER

(75) Inventors: Yoshifumi Nakamura, Osaka (JP); Ryuichi Sahara, Osaka (JP); Nozomi Shimoishizaka, Kyoto (JP); Kazuyuki Kainou, Osaka (JP); Keiji Miki, Kyoto (JP); Kazumi Watase, Kyoto (JP); Yasutake Yaguchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/919,402

(22) Filed: Aug. 17, 2004

(65) Prior Publication Data

US 2005/0012214 A1 Jan. 20, 2005

Related U.S. Application Data

(62) Division of application No. 10/307,450, filed on Dec. 2, 2002, now Pat. No. 6,784,557.

(30) Foreign Application Priority Data

Dec. 20, 2001 (JP) ....................................... 2001-387051

(51) Int. Cl.$^{7}$ ................................................ H01L 23/48

(52) U.S. Cl. ....................... 257/784; 257/673; 257/693; 257/737; 257/738; 257/773; 257/775; 257/780

(58) Field of Search ................................ 257/669, 770, 257/673, 674, 676, 688, 692–697, 728–752, 758, 773–776, 780–786

(56) References Cited

U.S. PATENT DOCUMENTS

| | | | | |
|---|---|---|---|---|
| 5,604,379 A | | 2/1997 | Mori | |
| 5,821,627 A | * | 10/1998 | Mori et al. | 257/780 |
| 5,892,273 A | | 4/1999 | Iwasaki et al. | |
| 6,207,473 B1 | | 3/2001 | Hirai et al. | |
| 6,396,157 B2 | | 5/2002 | Nakanishi et al. | |
| 6,414,390 B2 | | 7/2002 | Nozawa | |
| 6,475,896 B1 | | 11/2002 | Hashimoto | |
| 6,512,298 B2 | | 1/2003 | Sahara et al. | |
| 6,587,353 B2 | | 7/2003 | Sumikawa et al. | |
| 6,614,113 B2 | * | 9/2003 | Watanabe et al. | 257/750 |
| 6,662,442 B1 | * | 12/2003 | Matsui et al. | 29/852 |
| 2002/0060904 A1 | * | 5/2002 | Higuchi | 361/760 |
| 2002/0079575 A1 | * | 6/2002 | Hozoji et al. | 257/734 |
| 2002/0108781 A1 | * | 8/2002 | Mune et al. | 174/264 |

FOREIGN PATENT DOCUMENTS

| | | |
|---|---|---|
| CN | 1234908 A | 11/1999 |
| JP | 9-129772 A | 5/1997 |
| JP | 10079362 | 3/1998 |
| JP | 2000-188305 | 7/2000 |
| JP | 2000-299405 A | 10/2000 |
| JP | 3137322 | 12/2000 |
| JP | 2001-118956 A | 4/2001 |
| JP | 2001-135742 A | 5/2001 |
| JP | 2001-291721 A | 10/2001 |
| JP | 2001-291733 A | 10/2001 |

OTHER PUBLICATIONS

US 5,719,439, 2/1998, Iwasaki et al. (withdrawn)

* cited by examiner

*Primary Examiner*—Andy Huynh
(74) *Attorney, Agent, or Firm*—McDermott Will & Emery LLP

(57) ABSTRACT

The semiconductor device includes a semiconductor element having an electrode formed on a surface thereof, and a metal wiring formed on the surface of the semiconductor element and electrically connected to the electrode. The metal wiring has an external electrode portion functioning as an external electrode. A thickness of the external electrode portion is greater than that of a non-electrode portion of the metal wiring, i.e., a portion of the metal wiring other than the external electrode portion.

18 Claims, 11 Drawing Sheets

SEMICONDUCTOR DEVICE INCLUDING A DIFFUSION LAYER

This application is a divisional of Ser. No. 10/307,450 filed Dec. 2, 2002, now U.S. Pat. No. 6,784,557.

BACKGROUND OF THE INVENTION

The present invention generally relates to a semiconductor device in which a metal wiring is formed so as to be electrically connected to an electrode of a semiconductor element and a part of the metal wiring is used as an external electrode, and a manufacturing method of the same. More particularly, the present invention relates to a semiconductor device having excellent junction reliability between a metal wiring and a ball electrode mounted to an external electrode portion of the metal wiring, and a manufacturing method of the same.

With recent reduction in size and improvement in functions of electronic equipments, an increasing number of input/output (I/O) pins is formed in a semiconductor element, and therefore the pitch of electrodes is reduced.

Especially in a CSP (Chip Size Package) type semiconductor device, electrodes of a semiconductor element are formed by a dry etching method in a diffusion process, whereas wiring electrodes of a substrate on which the semiconductor element is mounted are formed by a wet etching method in an assembling process. Accordingly, the pitch of the wiring electrodes of the substrate on which the semiconductor element is mounted is necessarily greater than that of the electrodes of the semiconductor element. In view of this, a semiconductor device is increasingly developed which deals with the difference between the electrode pitch of the semiconductor element and the wiring-electrode pitch of the substrate. In such a semiconductor device, metal wirings are formed so as to be electrically connected to the respective electrodes of the semiconductor element and a part of each metal wiring is used as an external electrode in order to increase the distance between the external electrodes.

Hereinafter, a conventional semiconductor device will be described with reference to the figures.

FIG. 15A is a perspective plan view of the conventional semiconductor device. FIG. 15B shows an example of the cross-sectional structure taken along line XV—XV of FIG. 15A. FIG. 15C shows another example of the cross-sectional structure taken along line XV—XV of FIG. 15A.

As shown in FIGS. 15A and 15B, electrodes 2 are formed on the surface of a semiconductor element 1. A passivation film 3 is formed over the surface of the semiconductor element 1. The passivation film 3 is formed from silicon nitride (SiN) or the like, and has an opening on each electrode 2. Metal wirings 4 are formed on the passivation film 3. Each metal wiring 4 is formed from copper (Cu) and electrically connected to a corresponding one of the electrodes 2. A solder resist film 5 is formed on the metal wirings 4 and the passivation film 3. The solder resist film 5 has an opening on a portion of each metal wiring 4 which functions as an external electrode (hereinafter, referred to as "external electrode portion"). In order to electrically connect the electrodes 2 formed on the surface of the semiconductor element 1 to wiring electrodes of a substrate (not shown) on which the semiconductor element 1 is mounted, respectively, a ball electrode 6 formed from solder is connected in a molten state to each opening of the solder resist film 3, that is, to the external electrode portion of each metal wiring 4.

As shown in FIG. 15C, an insulating resin layer 7 may be formed between the semiconductor element 1 having the passivation film 3 thereon and the metal wirings 4.

In each of the forms of the conventional semiconductor device described above, the wiring electrodes of the substrate on which the semiconductor device is mounted are respectively connected to the metal wirings 4 of Cu formed on the surface of the semiconductor element 1 through the ball electrodes 6 formed from solder. In other words, when the metal wirings 4 are formed from Cu (which is a commonly used metal wiring material), metal junction of Cu (the metal wirings 4) and solder (the ball electrodes 6) is formed at the boundary between the metal wiring 4 and the ball electrode 6.

In the above conventional semiconductor device, however, tin (Sn) contained in solder of the ball electrode 6 diffuses into Cu of the metal wiring 4 to form a Sn—Cu alloy layer. As a result, in the portion of the metal wiring 4 on which the ball electrode 6 is mounted (i.e., the external electrode portion) and the portion near the external electrode portion, the Sn—Cu alloy grows in the most part of the metal wiring 4. The Sn—Cu alloy is weak and hard. The semiconductor device 1, the resin film covering the surface of the semiconductor element 1 and the substrate have different thermal expansion coefficients. Accordingly, when the temperature is varied to melt the ball electrodes in the process of mounting the semiconductor device onto the substrate, stresses are generated due to such a difference in thermal expansion coefficient. Accordingly, the Cu—Sn alloy layer formed in the portion of the metal wiring 4 to which the ball electrode 6 is mounted is likely to be broken by the stresses.

SUMMARY OF THE INVENTION

In view of the above problems, it is an object of the present invention to provide a semiconductor device having a metal wiring electrically connected to an electrode of a semiconductor element, and having improved junction reliability between the metal wiring and a ball electrode mounted on an external electrode portion of the metal wiring.

According to one aspect of the present invention, a semiconductor device includes a semiconductor element having an electrode formed on a surface thereof, and a metal wiring formed on the surface of the semiconductor element and electrically connected to the electrode. The metal wiring has an external electrode portion functioning as an external electrode. A thickness of the external electrode portion is greater than that of a non-electrode portion of the metal wiring, i.e., a portion of the metal wiring other than the external electrode portion.

According to the above semiconductor device, in the metal wiring electrically connected to the electrode of the semiconductor element, the thickness of the external electrode portion is greater than that of the non-electrode portion. The external electrode portion of the metal wiring and a wiring electrode of a substrate on which the semiconductor device is mounted may be connected to each other by a ball electrode formed from solder. In this case, when the metal wiring contain, e.g., Cu (which is a commonly used metal wiring material), Sn contained in solder of the ball electrode diffuses into Cu contained in the metal wiring, whereby a Sn—Cu alloy layer having low strength grows in the thickness direction of the external electrode portion. However, since the thickness of the external electrode portion of the metal wiring is greater than that of the non-electrode portion of the metal wiring, this Sn—Cu alloy layer can be prevented from growing through the entire thickness of the external electrode portion. In other words, it is ensured that the thickness of the low-strength Sn—Cu alloy layer in the external electrode portion of the metal wiring is smaller than the thickness of the external electrode portion. Since a part of the external electrode portion is left unchanged into the Sn—Cu alloy layer, the strength of the metal wiring can be maintained even if Cu is used as a metal wiring material. The semiconductor element, the resin film covering the surface of the semiconductor element, and the substrate have different thermal expansion coefficients. Therefore, when the temperature is varied in the process of hardening the resin film covering the surface of the semiconductor element or the process of mounting the semiconductor device onto the substrate, stresses are generated due to such a difference in thermal expansion coefficient. However, the above structure can prevent disconnection of the metal wiring even if such stresses are generated.

According to the above semiconductor device, the thickness of the non-electrode portion of the metal wiring is smaller than that of the external electrode portion to which the ball electrode is mounted. The metal wiring having a small thickness facilitates formation of fine wirings by etching. As a result, the width of the metal wiring or the pitch of the metal wirings can be reduced, enabling reduction in size of the semiconductor device.

Preferably, the semiconductor device further includes an insulating film formed on the metal wiring and the surface of the semiconductor element, and having an opening exposing the external electrode portion. An exposed surface of the external electrode portion is preferably flush with or higher than a surface of the insulating film.

This prevents a wiring or electrode of a substrate on which the semiconductor device is mounted from contacting the non-electrode portion of the metal wiring of the semiconductor device. Moreover, the exposed surface of the external electrode portion is flush with or higher than the surface of the insulating film. Therefore, the ball electrode can be mounted to the external electrode portion without producing a gap therebetween. As a result, sufficient junction between the ball electrode and the external electrode portion can be ensured. When the exposed surface of the external electrode portion is higher than the surface of the insulating film, a substantial thickness of a metal portion of the external electrode portion is increased. Therefore, the following effects can be obtained: when Sn contained in solder of the ball electrode diffuses into Cu contained in the metal wiring, a Sn—Cu alloy layer having low strength grows in the thickness direction of the external electrode portion. As described above, however, since the substantial thickness of the metal portion of the external electrode portion is increased, it is ensured that a greater part of the external electrode portion is left unchanged into the Sn—Cu alloy in the thickness direction of the external electrode portion. When the temperature is varied in a process such as the process of mounting the semiconductor device onto the substrate, stresses are generated due to the difference in thermal expansion coefficient between the semiconductor device and the substrate. However, the above structure can more reliably prevent disconnection of the metal wiring even if such stresses are generated. Note that, when the exposed surface of the external electrode portion is higher than the surface of the insulating film, the external electrode portion may be bonded to the wiring electrode of the substrate by solder without using the ball electrode. In this case, the same effects as those described above can be obtained.

Preferably, the metal wiring is formed from a metal containing copper.

This enables reduction in resistance of the metal wiring.

Preferably, the above semiconductor device further includes an insulating resin layer formed between the surface of the semiconductor element and the metal wiring. The metal wiring is preferably formed along a surface of the insulating resin layer.

When the temperature is varied to melt the ball electrode in the process of mounting the semiconductor device to the substrate, stresses are generated due to the difference in thermal expansion coefficient between the semiconductor device and the substrate. However, these stresses can be absorbed by the insulating resin layer. As a result, the stresses are reduced, whereby the external electrode portion of the metal wiring to which the ball electrode is connected can be prevented from being broken by the stresses.

Preferably, the thickness of the external electrode portion is in a range of 10 $\mu$m to 20 $\mu$m.

In this case, the metal wiring can be reliably prevented from being disconnected at the external electrode portion, and pattern deformation generated in the process of forming the external electrode portion having a greater thickness by etching can be suppressed.

According to another aspect of the present invention, a method for manufacturing a semiconductor device includes: a first step of forming, on a surface of a semiconductor element having an electrode formed thereon, a metal wiring electrically connected to the electrode; a second step of forming, on the surface of the semiconductor element and the metal wiring, an insulating film having an opening which exposes a region of the metal wiring layer where an external electrode is to be formed; and a third step of forming a metal-material embedded portion in the opening so that a surface of the metal-material embedded portion is flush with or higher than a surface of the insulating film.

According to the above manufacturing method, the metal wiring is formed so as to be electrically connected to the electrode of the semiconductor element. The insulating film is then formed so as to have an opening which exposes the region of the metal wiring where an external electrode is to be formed. Thereafter, the metal-material embedded portion is embedded in the opening so that the surface of the metal-material embedded portion is flush with or higher than the surface of the insulating film. As a result, the thickness of the external electrode portion (i.e., the total thickness of the metal-material embedded portion embedded in the opening and the metal wiring located under the metal-material embedded portion) is greater than the thickness of a non-electrode portion of the metal wiring, that is, the portion of the metal wiring other than the external electrode portion. Accordingly, the same effects as those of the semiconductor device of the present invention can be obtained.

According to the above manufacturing method, the non-electrode portion of the metal wiring (i.e., the portion of the metal wiring other than the external electrode portion) is covered with the insulating film. This prevents a wiring or electrode of a substrate on which the semiconductor device is mounted from contacting the non-electrode portion of the metal wiring of the semiconductor device. Moreover, the surface of the metal-material embedded portion, that is, the exposed surface of the external electrode portion, is flush with or higher than the surface of the insulating film. Therefore, a ball electrode can be mounted to the external electrode portion without producing a gap therebetween. As a result, sufficient junction between the ball electrode and the external electrode portion can be ensured. When the exposed surface of the external electrode portion is higher than the surface of the insulating film, a substantial thickness of a metal portion of the external electrode portion is increased. Therefore, the following effects can be obtained: when Sn contained in solder of the ball electrode diffuses into Cu contained in the metal wiring, a Sn—Cu alloy layer having low strength grows in the thickness direction of the external electrode portion. As described above, however, since the substantial thickness of the metal portion of the external electrode portion is increased, it is ensured that a greater part of the external electrode portion is left unchanged into the Sn—Cu alloy in the thickness direction of the external electrode portion. When the temperature is varied in a process such as the process of mounting the semiconductor device onto the substrate, stresses are generated due to the difference in thermal expansion coefficient between the semiconductor device and the substrate. However, the above structure can more reliably prevent disconnection of the metal wiring even if such stresses are generated. Note that, when the exposed surface of the external electrode portion (i.e., the surface of the metal-material embedded portion) is higher than the surface of the insulating film, the external electrode portion may be bonded to the wiring electrode of the substrate by solder without using the ball electrode. In this case, the same effects as those described above can be obtained.

Preferably, the above manufacturing method further includes, before the first step, the step of forming an insulating resin film on the surface of the semiconductor element except the electrode. The first step preferably includes the step of forming the metal wiring along a surface of the insulating resin layer.

When the temperature is varied to melt a ball electrode in the process of mounting the semiconductor device to the substrate, stresses are generated due to the difference in thermal expansion coefficient between the semiconductor device and the substrate. According to the above manufacturing method, however, these stresses can be absorbed by the insulating resin layer. As a result, the stresses are reduced, whereby the external electrode portion of the metal wiring to which the ball electrode is connected can be prevented from being broken by the stresses.

In the above manufacturing method, the third step may include the step of forming a metal film on the insulating film so as to completely fill the opening, forming a mask pattern which covers a region of the metal film located on the opening, removing a region of the metal film located outside the mask pattern, and removing the mask pattern.

In the above manufacturing method, the third step may include the step of forming a first metal film on the surface of the insulating film so as to partially fill the opening, forming a mask pattern which covers a region of the first metal film located outside the opening, forming a second metal film on a region of the first metal film located in the opening, and removing the mask pattern and the region of the first metal film located outside the opening.

In the above manufacturing method, the semiconductor element may be provided in each of a plurality of chip regions of a semiconductor wafer, which are defined by a dicing line. The method may further include, after the third step, the step of dicing the semiconductor wafer along the dicing line by a rotating blade in order to divide the semiconductor wafer into chips of the semiconductor elements.

According to still another aspect of the present invention, a method for manufacturing a semiconductor device includes: a first step of forming, on a surface of a semiconductor element having an electrode formed thereon, a metal wiring electrically connected to the electrode; a second step of forming a projecting electrode on a region of the metal wiring where an external electrode is to be formed; and a third step of forming an insulating film on the surface of the semiconductor element and the metal wiring so as to expose at least a top portion of the projecting electrode.

According to the above manufacturing method, the metal wiring is formed so as to be electrically connected to the electrode of the semiconductor element. The projecting electrode is then formed on the region of the metal wiring where an external electrode is to be formed. Thereafter, the insulating film is formed so as to expose at least the top portion of the projecting electrode. As a result, the thickness of the external electrode portion (i.e., the total thickness of the projecting electrode and the metal wiring located thereunder) is greater than the thickness of a non-electrode portion of the metal wiring, that is, the portion of the metal wiring other than the external electrode portion. Accordingly, the same effects as those of the semiconductor device of the present invention can be obtained.

According to the above manufacturing method, the non-electrode portion of the metal wiring (i.e., the portion of the metal wiring other than the external electrode portion) is covered with the insulating film. This prevents a wiring or electrode of a substrate on which the semiconductor device is mounted from contacting the non-electrode portion of the metal wiring of the semiconductor device. Moreover, the surface of the top portion of the projecting electrode, that is, the exposed surface of the external electrode portion, is higher than the surface of the insulating film. Therefore, a ball electrode can be mounted to the external electrode portion without producing a gap therebetween. As a result, sufficient junction between the ball electrode and the external electrode portion can be ensured. Moreover, since the exposed surface of the external electrode portion is higher than the surface of the insulating film, a substantial thickness of a metal portion of the external electrode portion is increased. Therefore, the following effects can be obtained: when Sn contained in solder of the ball electrode diffuses into Cu contained in the metal wiring, a Sn—Cu alloy layer having low strength grows in the thickness direction of the external electrode portion. As described above, however, since the substantial thickness of the metal portion of the external electrode portion is increased, it is ensured that a greater part of the external electrode portion is left unchanged into the Sn—Cu alloy in the thickness direction of the external electrode portion. When the temperature is varied in a process such as the process of mounting the semiconductor device onto the substrate, stresses are generated due to the difference in thermal expansion coefficient between the semiconductor device and the substrate. However, the above structure can more reliably prevent disconnection of the metal wiring even if such stresses are generated. Note that, when the exposed surface of the external electrode portion (i.e., the top portion of the projecting electrode) is higher than the surface of the insulating film, the external electrode portion may be bonded to the wiring electrode of the substrate by solder without using the ball electrode. In this case, the same effects as those described above can be obtained.

Preferably, the above manufacturing method further includes, before the first step, the step of forming an insulating resin film on the surface of the semiconductor element except the electrode. The first step preferably includes the step of forming the metal wiring along a surface of the insulating resin layer.

When the temperature is varied to melt a ball electrode in the process of mounting the semiconductor device to the substrate, stresses are generated due to the difference in thermal expansion coefficient between the semiconductor device and the substrate. According to the above manufacturing method, however, these stresses can be absorbed by the insulating resin layer. As a result, the stresses are reduced, whereby the external electrode portion of the metal wiring to which the ball electrode is connected can be prevented from being broken by the stresses.

In the above manufacturing method, the semiconductor element may be provided in each of a plurality of chip regions of a semiconductor wafer, which are defined by a dicing line. The above manufacturing method may further includes, after the third step, the step of dicing the semiconductor wafer along the dicing line by a rotating blade in order to divide the semiconductor wafer into chips of the semiconductor elements.

DESCRIPTION OF THE PREFERRED EMBODIMENTS (First Embodiment)

Hereinafter, a semiconductor device according to the first embodiment of the present invention will be described with reference to the figures.

Figure 1:
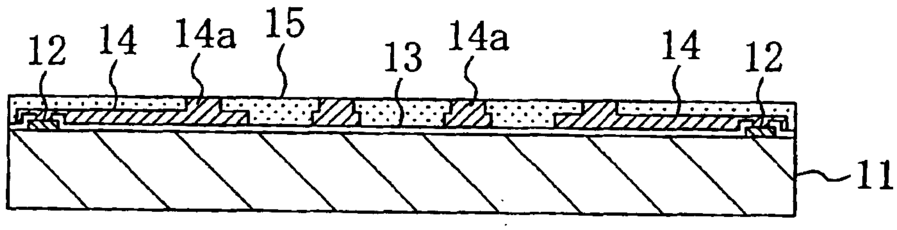
FIG. 1 is a cross-sectional view of a semiconductor device according to a first embodiment of the present invention.
Figure 2:
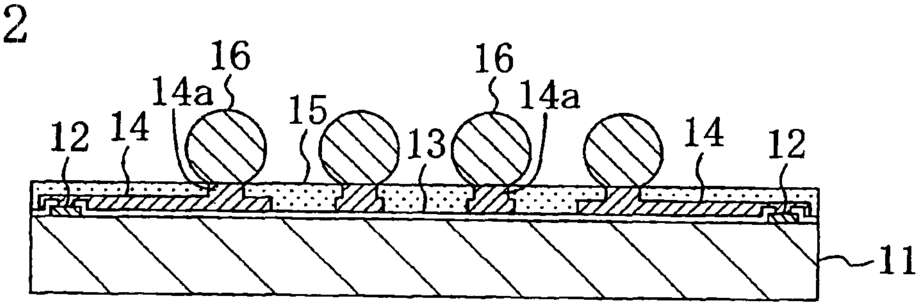
FIG. 2 is a cross-sectional view of the semiconductor device according to the first embodiment of the present invention.

FIGS. 1 and 2 are cross-sectional views of the semiconductor device of the first embodiment.

As shown in FIG. 1, electrodes 12 are formed on the surface of a semiconductor element 11. A passivation film 13 is formed over the surface of the semiconductor element 11. The passivation film 13 is formed from, e.g., SiN, and has an opening on each electrode 12. The passivation film 13 protects the surface of the semiconductor element 11. Metal wirings 14 containing, e.g., Cu are formed on the passivation film 13. Each metal wiring 14 is electrically connected to a corresponding one of the electrodes 12. An insulating film 15 is formed on the metal wirings 14 and the passivation film 13. The insulating film 15 has openings in order to expose a portion of each metal wiring 14 which functions as an external electrode (hereinafter, referred to as "external electrode portion 14*a*"). For example, the insulating film 15 is a resin film formed from solder resist or the like. As shown in FIG. 2, in order to electrically connect the electrodes 12 formed on the surface of the semiconductor element 11 to wiring electrodes of a substrate (not shown) on which the semiconductor element 11 is mounted, ball electrodes 16, which are formed from solder, are connected in a molten state to the openings of the insulating film 15, that is, the external electrode portions 14*a* of the metal wirings 14, respectively. The electrodes 12 of the semiconductor element 11 and the wiring electrodes of the substrate are thus respectively connected to each other through the metal wirings 14 and the ball electrodes 16.

The present embodiment is characterized in that the thickness (e.g., 14 μm) of the external electrode portion 14*a* of the metal wiring 14 is greater than that of the other portion of the metal wiring 14 (hereinafter, referred to as "non-electrode portion"). For example, such external electrode portions 14*a* having a greater thickness is formed by the following method: first, the insulating film 15 is formed. Openings are formed in the insulating film 15 at positions where the ball electrodes 16 are to be mounted on the Cu-containing metal wirings 14, respectively. Thereafter, the openings are filled with a metal material (more specifically, Cu). The external electrode portions 14*a* having a greater thickness are thus formed. In this case, the thickness of the external electrode portion 14*a* is equal to the total thickness of the metal wiring 14 and the portion filled with the metal material (hereinafter, referred to as "metal-material embedded portion").

According to the first embodiment, in each metal wiring 14 electrically connected to a corresponding one of the electrodes 12, the thickness of the external electrode portion 14*a* is greater than that of the non-electrode portion. The external electrode portions 14*a* and the wiring electrodes of the substrate on which the semiconductor device is mounted are respectively connected to each other by the ball electrodes 16. When the metal wirings 14 contain, e.g., Cu (which is a commonly used metal wiring material), Sn contained in solder of the ball electrode 16 diffuses into Cu contained in the metal wiring 14, whereby a Sn—Cu alloy layer having low strength grows in the thickness direction of the external electrode portion 14*a*. However, since the thickness of the external electrode portion 14*a* of the metal wiring 14 is greater than that of the non-electrode portion of the metal wiring 14, this Sn—Cu alloy layer can be prevented from growing through the entire thickness of the external electrode portion 14*a*. In other words, it is ensured that the thickness of the Sn—Cu alloy layer in the external electrode portion 14*a* is smaller than the thickness of the external electrode portion 14*a*. Since a part of the external electrode portion 14*a* is left unchanged into the Sn—Cu alloy layer, the strength of the metal wiring 14 can be maintained even if Cu is used as a metal wiring material. The semiconductor element 11, the resin film covering the surface of the semiconductor element 11, and the substrate have different thermal expansion coefficients. Therefore, when the temperature is varied in the process of hardening the resin film covering the surface of the semiconductor element 11 or the process of mounting the semiconductor device onto the substrate, stresses are generated due to such a difference in thermal expansion coefficient. Even if such stresses are generated, however, the above structure of the first embodiment can prevent the Sn—Cu alloy layer having low strength from being broken and thus can prevent disconnection of the metal wirings 14.

More specifically, in the first embodiment, the thickness of the non-electrode portion of the metal wiring 14 is preferably in the range of 0.01 μm to 8 μm, and more preferably in the range of 0.01 μm to 4 μm. The reason for this is as follows: if the thickness of the metal wiring 14 is less than 0.01 μm, the strength of the metal wiring 14 is reduced, causing disconnection and the like. If the thickness of the metal wiring 14 is greater than 8 μm, it is difficult to etch the metal film for forming the metal wirings 14. This makes it difficult to reduce the size of the wiring pattern of the metal wirings 14.

In the first embodiment, the thickness of the external electrode portion 14*a* of the metal wiring 14 (e.g., the total thickness of the non-electrode portion of the metal wiring 14 and the metal-material embedded portion) is preferably in the range of 10 μm to 20 μm. The reason for this is as follows: the inventors fabricated a plurality of semiconductor device samples so that the external electrode portion 14*a* of each metal wiring 14 has a greater thickness than the non-electrode portion of the metal wiring 14. Such external electrode portions 14*a* were formed by forming the metal-material embedded portion in each opening of the insulating film 15 (i.e., on each region where an external electrode is to be formed; hereinafter, referred to as "external-electrode formation region"). In these semiconductor device samples, the thickness of the external electrode portion 14*a* was 5 μm, 7 μm, 9 μm and 11 μm, respectively. After each semiconductor device sample was mounted on a substrate, a temperature cycle test (environment reliability test) was conducted in order to determine whether or not each semiconductor device sample is capable of preventing disconnection of the metal wirings 14. In the temperature cycle test, each semiconductor device sample mounted on the substrate was repeatedly subjected to the temperatures of −40° C. and 80° C. In this experimentation, 1,000 cycles were conducted in the temperature cycle test. In each cycle, the temperature was varied from −40° C. to 80° C. and then reduced back to −40° C. The following result was obtained by the temperature cycle test: when the thickness of the external electrode portion 14*a* (the total thickness of the metal wiring 14 and the metal-material embedded portion) is 5 μm, the metal wiring 14 was disconnected at 50 cycles. For 7 μm, the metal wiring 14 was disconnected at 200 cycles. For 9 μm, the metal wiring 14 was disconnected at 700 cycles. For 11 μm, the metal wiring 14 was not disconnected. The above experimentation result shows that the thicker the external electrode portion 14*a* is, the less the metal wiring 14 is likely to be disconnected. More specifically, the metal wiring 14 is less likely to be disconnected when the thickness of the external electrode portion 14*a* is about 10 μm or more. Note that the external electrode portion 14*a* having a greater thickness than the non-electrode portion of the metal wiring 14 is herein formed using the metal-material embedded portion. In this case, if the thickness of the external electrode portion 14*a* exceeds 20 μm, greater pattern deformation would be generated in the process of forming the metal-material filling portion by a wet etching method.

According to the first embodiment, the portion of the metal wiring 14 other than the external electrode portion 14*a* (i.e., the non-electrode portion of the metal wiring 14) is covered with the insulating film 15. This prevents wirings or electrodes of the substrate on which the semiconductor device is mounted from contacting the non-electrode portions of the metal wirings 14 of the semiconductor device. It is preferable that the exposed surface of the external electrode portion 14*a* is flush with or higher than the surface of the insulating film 15 (in the specification, the term "flush" also includes "approximately flush"). In other words, it is preferable that the thickness of the external electrode portion 14*a* is equal to or greater than that of the insulating film 15 (in the specification, the term "equal" also includes "approximately equal"). The reason for this is as follows: if the external electrode portion 14*a* is thinner than the insulating film 15, the ball electrode 16 cannot be mounted to the external electrode portion 14*a* (that is, the opening of the insulating film 15) without producing a gap therebetween. As a result, sufficient junction between the ball electrode 16 and the external electrode portion 14*a* cannot be ensured.

Note that, in the first embodiment, the material of the metal wirings 14 is not specifically limited. For example, a material mainly containing Cu, titanium (Ti), tungsten (W), chromium (Cr), aluminum (Al) or the like may be used. Alternatively, another conductive metal material may be used. However, forming the metal wiring 14 from a Cu-containing metal enables reduction in resistance of the metal wiring 14.

(Modification of First Embodiment)

Hereinafter, a semiconductor device according to a modification of the first embodiment will be described with reference to the figures.

Figure 3:
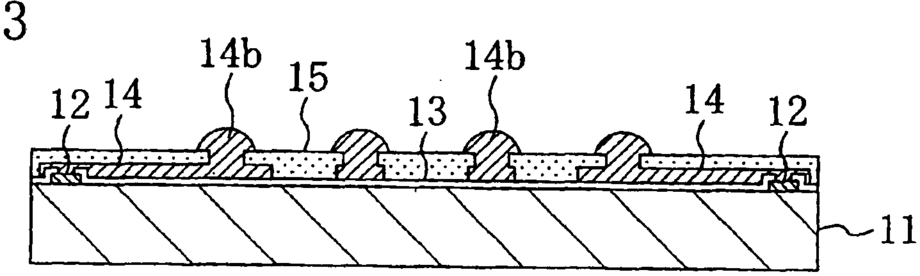
FIG. 3 is a cross-sectional view of a semiconductor device according to a modification of the first embodiment of the present invention.

FIG. 3 is a cross-sectional view of the semiconductor device according to the modification of the first embodiment. Note that, in the modification of the first embodiment, the same elements as those of the semiconductor device of the first embodiment in FIG. 1 are denoted with the same reference numerals and characters, and description thereof is omitted.

As shown in FIG. 3, electrodes 12 are formed on the surface of a semiconductor element 11. A passivation film 13 is formed over the surface of the semiconductor element 11. The passivation film 13 has an opening on each electrode 12. Metal wirings 14 are formed on the passivation film 13. Each metal wiring 14 is electrically connected to a corresponding one of the electrodes 12. An insulating film 15 is formed on the metal wirings 14 and the passivation film 13. The insulating film 15 has openings in order to expose a portion of each metal wiring 14 which functions as an external electrode (hereinafter, referred to as "external electrode portion 14*b*").

The modification of the first embodiment is different from the first embodiment in that each external electrode portion 14*b* has a mushroom-like projection over a corresponding one of the openings of the insulating film 15. The mushroom-like projection is larger than the opening of the insulating film 15. Therefore, the exposed surface of the external electrode portion 14*b* is higher than the surface of the insulating film 15. As a result, a substantial thickness of a metal portion of the external electrode portion 14*b* is larger than that of the external electrode portion 14*a* of the first embodiment in FIG. 1. Therefore, the following effects can be obtained: when the external electrode portions 14*b* and wiring electrodes of a substrate on which the semiconductor device is mounted are respectively connected to each other by ball electrodes formed from solder, Sn contained in solder of the ball electrode diffuses into Cu contained in the metal wiring 14. As a result, a Sn—Cu alloy layer having low strength grows in the thickness direction of the external electrode portion 14*b*. As described above, however, the substantial thickness of the metal portion of the external electrode portion 14*b* is larger than that of the external electrode portion 14*a* of the first embodiment in FIG. 1. It is therefore ensured that a greater part of the external electrode portion 14*b* is left unchanged into the Sn—Cu alloy in the thickness direction of the external electrode portion 14*b*. When the temperature is varied in a process such as the process of mounting the semiconductor device onto the substrate, stresses are generated due to the difference in thermal expansion coefficient between the semiconductor device and the substrate. However, the above structure of the modification of the first embodiment can more reliably prevent disconnection of the metal wirings 14 even if such stresses are generated.

Note that, in the modification of the first embodiment, the external electrode portions 14*b* may be bonded to the wiring electrodes of the substrate by solder without using the ball electrodes. In this case, the same effects as those described above can be obtained.

(Second Embodiment)

Hereinafter, a semiconductor device according to the second embodiment of the present invention will be described with reference to the figures.

Figure 4:
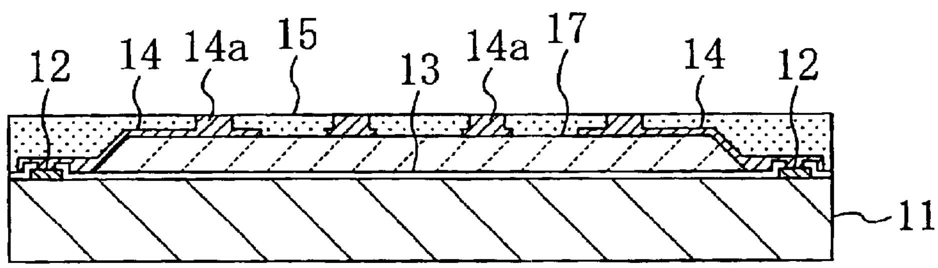
FIG. 4 is a cross-sectional view of a semiconductor device according to a second embodiment of the present invention.
Figure 5:
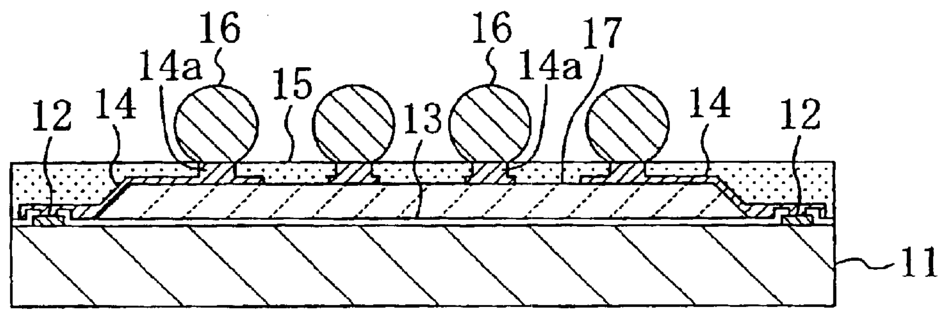
FIG. 5 is a cross-sectional view of the semiconductor device according to the second embodiment of the present invention.

FIGS. 4 and 5 are cross-sectional views of the semiconductor device of the second embodiment. Note that, in the second embodiment, the same elements as those of the semiconductor device of the first embodiment in FIG. 1 are denoted with the same reference numerals and characters, and description thereof is partly omitted.

As shown in FIG. 4, electrodes 12 are formed on the surface of a semiconductor element 11. A passivation film 13 is formed over the surface of the semiconductor element 11. The passivation film 13 has an opening on each electrode 12. An insulating resin layer 17 is formed on the passivation film 13 excluding the regions near the electrodes 12. For example, the insulating resin layer 17 is formed from an epoxy resin having low elasticity. Metal wirings 14 are formed along the surface of the insulating resin layer 17. Each metal wiring 14 is electrically connected to a corresponding one of the electrodes 12. An insulating film 15 is formed on the metal wirings 14, the insulating resin layer 17 and the passivation film 13. The insulating film 15 has openings in order to expose a portion of each metal wiring 14 which functions as an external electrode (hereinafter, referred to as "external electrode portion 14*a*"). For example, the insulating film 15 is a resin film formed from solder resist or the like. As shown in FIG. 5, in order to electrically connect the electrodes 12 formed on the surface of the semiconductor element 11 to wiring electrodes of a substrate (not shown) on which the semiconductor element 11 is mounted, ball electrodes 16, which are formed from solder, are connected in a molten state to the openings of the insulating film 15, that is, the external electrode portions 14*a* of the metal wirings 14, respectively. The electrodes 12 of the semiconductor element 11 and the wiring electrodes of the substrate are thus respectively connected to each other through the metal wirings 14 and the ball electrodes 16.

A first characteristic of the second embodiment is that, like the first embodiment, the thickness of the external electrode portion 14*a* of the metal wiring 14 is greater than that of the other portion of the metal wiring 14 (i.e., the non-electrode portion).

A second characteristic of the second embodiment is that, as described above, the insulating resin layer 17, which is formed from an epoxy resin having low elasticity or the like, is formed between the metal wirings 14 each electrically connected to a corresponding one of the electrodes 12 of the semiconductor element 11 and the passivation film 13 formed over the surface of the semiconductor element 11.

According to the second embodiment, the following effects can be obtained in addition to the effects of the first embodiment (which are obtained by the first characteristic): when the temperature is varied to melt the ball electrodes 16 in the process of mounting the semiconductor device to the substrate, stresses are generated due to the difference in thermal expansion coefficient between the semiconductor device and the substrate. However, these stresses can be absorbed by the insulating resin layer 17. As a result, the stresses are reduced, whereby the external electrode portion 14*a* of the metal wiring 14 to which the ball electrode 16 is connected can be prevented from being broken by the stresses.

According to the second embodiment, the portion of the metal wiring 14 other than the external electrode portion 14*a* (i.e., the non-electrode portion of the metal wiring 14) is covered with the insulating film 15. This prevents wirings or electrodes of the substrate on which the semiconductor device is mounted from contacting the non-electrode portions of the metal wirings 14 of the semiconductor device. It is preferable that the exposed surface of the external electrode portion 14*a* is flush with or higher than the surface of the insulating film 15. In other words, it is preferable that the thickness of the external electrode portion 14*a* is equal to or greater than that of the insulating film 15 on the insulating resin layer 17. The reason for this is as follows: if the external electrode portion 14*a* is thinner than the insulating film 15 on the insulating resin layer 17, the ball electrode 16 cannot be mounted to the external electrode portion 14*a* (that is, the opening of the insulating film 15) without a gap therebetween. As a result, sufficient junction between the ball electrode 16 and the external electrode portion 14*a* cannot be ensured.

Note that, in the second embodiment, the material of the metal wirings 14 is not specifically limited. For example, a material mainly containing Cu, Ti, W, Cr, Al or the like may be used. Alternatively, another conductive metal material may be used. However, forming the metal wiring 14 from a Cu-containing metal enables reduction in resistance of the metal wiring 14.

(Modification of Second Embodiment)

Hereinafter, a semiconductor device according to a modification of the second embodiment will be described with reference to the figures.

Figure 6:
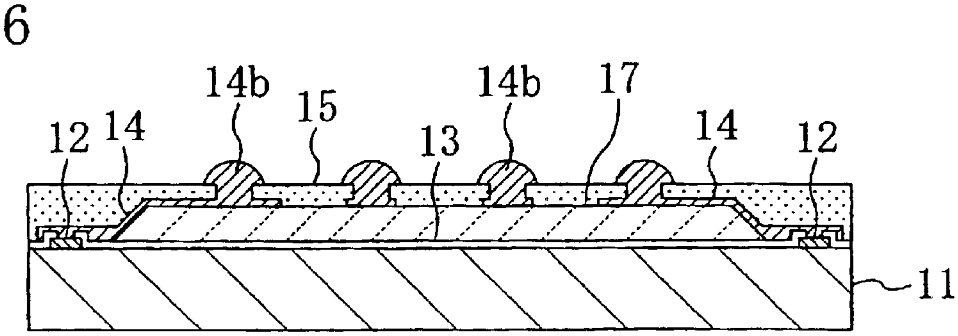
FIG. 6 is a cross-sectional view of a semiconductor device according to a modification of the second embodiment of the present invention.

FIG. 6 is a cross-sectional view of the semiconductor device according to the modification of the second embodiment. Note that, in the modification of the second embodiment, the same elements as those of the semiconductor device of the first embodiment in FIG. 1 or the semiconductor device of the second embodiment in FIG. 4 are denoted with the same reference numerals and characters, and description thereof is partly omitted.

As shown in FIG. 6, electrodes 12 are formed on the surface of a semiconductor element 11. A passivation film 13 is formed over the surface of the semiconductor element 11. The passivation film 13 has an opening on each electrode 12. An insulating resin layer 17 is formed on the passivation film 13 excluding the regions near the electrodes 12. For example, the insulating resin layer 17 is formed from an epoxy resin having low elasticity. Metal wirings 14 are formed along the surface of the insulating resin layer 17. Each metal wiring 14 is electrically connected to a corresponding one of the electrodes 12. An insulating film 15 is formed on the metal wirings 14, the insulating resin layer 17 and the passivation film 13. The insulating film 15 has openings in order to expose a portion of each metal wiring 14 which functions as an external electrode (hereinafter, referred to as "external electrode portion 14*b*").

The modification of the second embodiment is different from the second embodiment in that each external electrode portion 14*b* has a mushroom-like projection over a corresponding one of the openings of the insulating film 15. The mushroom-like projection is larger than the opening of the insulating film 15. Therefore, the exposed surface of the external electrode portion 14*b* is higher than the surface of the insulating film 15. As a result, a substantial thickness of a metal portion of the external electrode portion 14*b* is larger than that of the external electrode portion 14*a* of the second embodiment in FIG. 4. Therefore, the following effects can be obtained: when the external electrode portions 14*b* and wiring electrodes of a substrate on which the semiconductor device is mounted are respectively connected to each other by ball electrodes formed from solder, Sn contained in solder of the ball electrode diffuses into Cu contained in the metal wiring 14. As a result, a Sn—Cu alloy layer having low strength grows in the thickness direction of the external electrode portion 14*b*. As described above, however, the substantial thickness of the metal portion of the external electrode portion 14*b* is larger than that of the external electrode portion 14*a* of the second embodiment in FIG. 4. It is therefore ensured that a greater part of the external electrode portion 14*b* is left unchanged into the Sn—Cu alloy in the thickness direction of the external electrode portion 14*b*. When the temperature is varied in a process such as the process of mounting the semiconductor device onto the substrate, stresses are generated due to the difference in thermal expansion coefficient between the semiconductor device and the substrate. However, the above structure of the modification of the second embodiment can more reliably prevent disconnection of the metal wirings 14 even if such stresses are generated.

Note that, in the modification of the second embodiment, the external electrode portions 14*b* may be bonded to the wiring electrodes of the substrate by solder without using the ball electrodes. In this case, the same effects as those described above can be obtained.

(Third Embodiment)

Hereinafter, a method for manufacturing a semiconductor device according to the third embodiment of the present invention will be described with reference to the figures. Note that the manufacturing method of the third embodiment is a method for manufacturing the semiconductor device of the first embodiment.

Figure 7A:
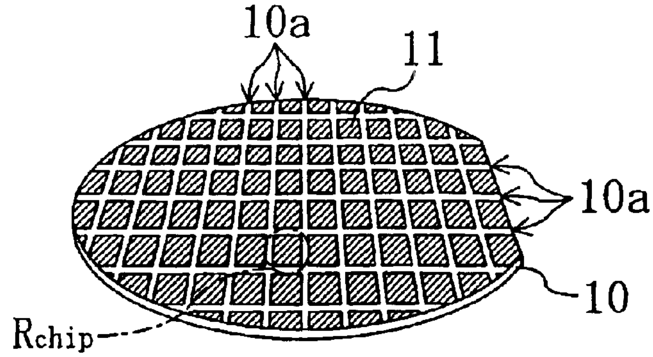
FIGS. 7A, 7B, 7C, 7D and 7E illustrate the steps of a method for manufacturing a semiconductor device according to a third embodiment of the present invention.
Figure 7B:
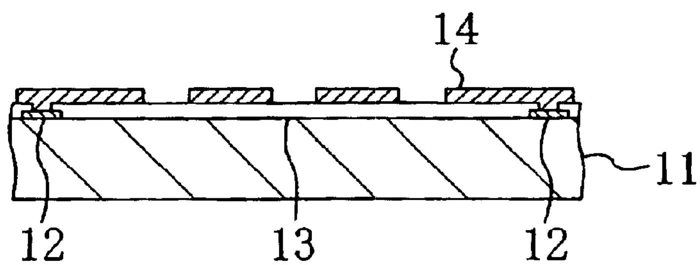
Figure 7C:
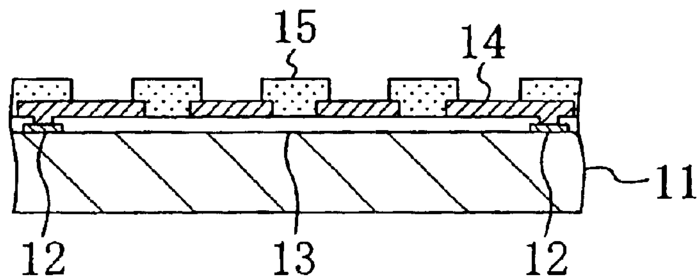
Figure 7D:
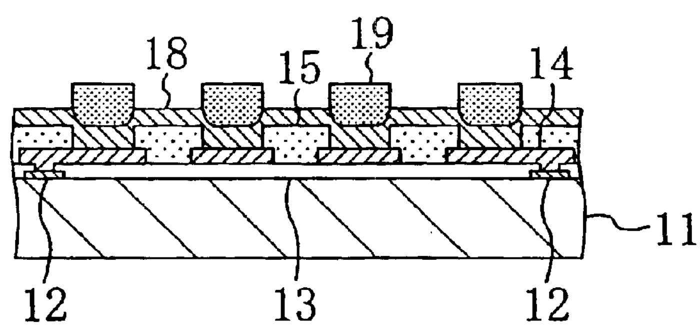
Figure 7E:
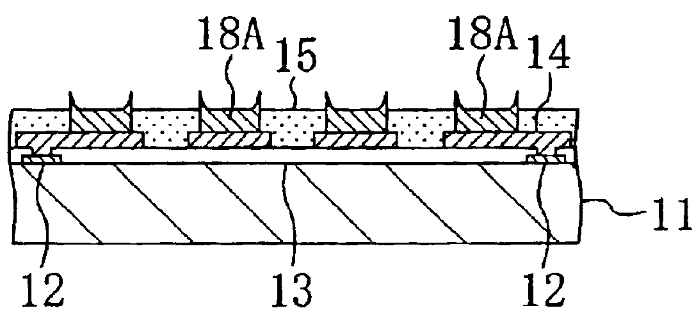
Figure 8A:
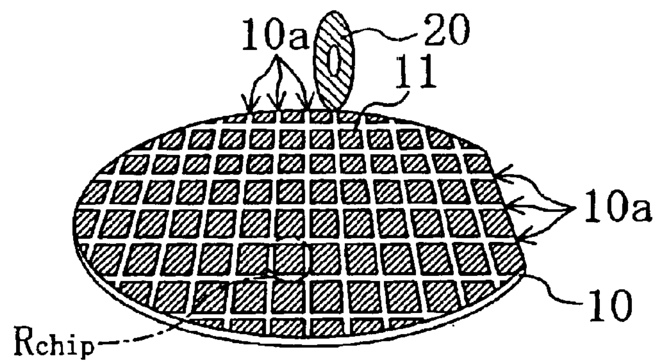
FIGS. 8A and 8B illustrate the steps of the method for manufacturing a semiconductor device according to the third embodiment of the present invention.

FIGS. 7A to 7E and FIGS. 8A, 8B illustrate the steps of the method for manufacturing a semiconductor device according to the third embodiment. FIGS. 7A and 8A are perspective views, and FIGS. 7B to 7E and FIG. 8B are cross-sectional views. In the third embodiment, the same elements as those of the semiconductor device of the first embodiment in FIGS. 1 and 2 are denoted with the same reference numerals and characters.

As shown in FIG. 7A, a semiconductor wafer 10 having a plurality of semiconductor elements 11 formed thereon is prepared. The semiconductor wafer 10 has a plurality of chip regions $R_{chip}$ defined by dicing lines 10*a*. Each semiconductor element 11 is provided in a corresponding one of the plurality of chip regions $R_{chip}$ of the semiconductor wafer 10. The following description will be given for the semiconductor element 11 provided in one of the plurality of chip regions $R_{chip}$.

As shown in FIG. 7B, a passivation film 13 is formed over the surface of the semiconductor element 11 having electrodes 12 formed thereon. For example, the passivation film 13 is formed from SiN. The passivation film 13 has an opening on each electrode 12. Metal wirings 14 containing, e.g., Cu are then formed on the passivation film 13 so as to be electrically connected to the electrodes 12, respectively. More specifically, the metal wirings 14 are formed as follows: a titanium tungsten (TiW) layer and a Cu layer are sequentially formed on the passivation film 13 by a sputtering method. The TiW layer and the Cu layer are then etched by using a mask which covers the regions where the metal wirings are to be formed (hereinafter, referred to as metal-wiring formation regions). The mask is formed from a photoresist material. The metal wirings 14 having a desired pattern are thus formed. The resist mask is then removed.

As shown in FIG. 7C, an insulating film 15 is formed on the passivation film 13 and the metal wirings 14. Openings are then formed in the insulating film 15 so as to expose a predetermined region of each metal wiring 14 (a region where an external electrode is to be formed; hereinafter, referred to as "external-electrode formation region") by an etching method using a resist material (not shown). For example, the insulating film 15 is a resin film having a thickness of 12 $\mu$m, and is formed from solder resist or the like. In the present embodiment, the insulating film 15 is formed from a photosensitive material. Therefore, the opening pattern of the insulating film 15 is formed by using a photolithography method capable of forming a fine pattern.

As shown in FIG. 7D, a metal film 18 is formed on the insulating film 15 by, e.g., an electroplating method so as to completely fill the openings of the insulating film 15. For example, the metal film 18 is formed from Ti and Cu. A resist mask 19 is then formed so as to cover the regions of the metal film 18 on the openings of the insulating film 15.

When the electroplating method is used in the step of FIG. 7D, wirings (not shown) formed in the dicing lines 10*a* of the semiconductor wafer 10 in FIG. 7A serve as a power feeding point of the electroplating method. These wirings are formed simultaneously with the metal wirings 14 by e.g., a sputtering method.

As shown in FIG. 7E, the portion of the metal film 18 located outside the resist mask 19 (i.e., the exposed portion of the metal film 18) is removed by, e.g., a wet etching method. As a result, metal-material embedded portions 18A are formed by the metal film 18 embedded in the openings of the insulating film 15. The resist mask 19 is then removed. Note that the surface of the metal-material embedded portions 18A is flush with or higher than the surface of the insulating film 15. As a result, the total thickness of the metal-material embedded portion 18A and the metal wiring 14 located thereunder is greater than the thickness of the portion of the metal wiring 14 other than the external electrode portion (i.e., the non-electrode portion of the metal wiring 14).

As shown in FIG. 8A, after the semiconductor elements 11 in the respective chip regions $R_{chip}$ of the semiconductor wafer 10 are subjected to the steps of FIGS. 7B to 7E, the semiconductor wafer 10 is diced along the dicing lines 10*a* into individual chips by a rotating blade 20. In this step, the wirings serving as a power feeding point in the electroplating method in the step of FIG. 7D are also cut in order to discontinue current application through the wirings.

Figure 8B:
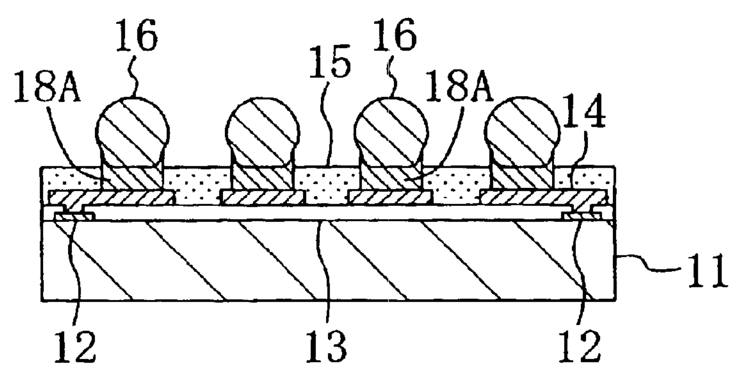

As shown in FIG. 8B, in order to electrically connect the electrodes 12 formed on the surface of the semiconductor element 11 to respective wiring electrodes of a substrate (not shown) on which the semiconductor element 11 is mounted, a ball electrode 16 is mounted on each metal-material embedded portion 18A (i.e., the external electrode portion of each metal wiring 14). For example, the ball electrodes 16 are formed from solder or Cu. The ball electrodes 16 may be formed from solder by printing solder paste to the metal-material embedded portions 18A by, e.g., a screen printing method and then reflowing the solder paste.

As has been described above, according to the third embodiment, the metal wirings 14 are formed so as to be electrically connected to the electrodes 12 of the semiconductor element 11, respectively. The insulating film 15 is then formed, and openings are formed in the insulating film 15 so as to expose the external-electrode formation regions of the metal wirings 14. Thereafter, the metal-material embedded portions 18A are embedded in the respective openings so that the surface of the metal-material embedded portions 18A is flush with or higher than the surface of the insulating film 15. Accordingly, the thickness of the external electrode portion of the metal wiring 14 (i.e., the total thickness of the metal-material embedded portion 18A embedded in the opening of the insulating film 15 and the metal wiring 14 located under the metal-material embedded portion 18A) is greater than the thickness of the portion of the metal wiring 14 other than the external electrode portion (i.e., the non-electrode portion of the metal wiring 14). As a result, the same effects as those of the semiconductor device of the first embodiment can be obtained. More specifically, the metal-material embedded portions 18A, that is, the external electrode portions, and the wiring electrodes of the substrate on which the semiconductor device is mounted are respectively connected to each other by the ball electrodes 16. When the metal wirings 14 contain, e.g., Cu (which is a commonly used metal wiring material), Sn contained in solder of the ball electrode 16 diffuses into Cu contained in the metal-material embedded portion 18A or the metal wiring 14, whereby a Sn—Cu alloy layer having low strength grows in the thickness direction of the external electrode portion. However, since the thickness of the external electrode portion of the metal wiring 14 is greater than that of the non-electrode portion of the metal wiring 14, this Sn—Cu alloy layer can be prevented from growing through the entire thickness of the external electrode portion. In other words, it is ensured that the thickness of the Sn—Cu alloy layer in the external electrode portion is smaller than the thickness of the external electrode portion. Since a part of the external electrode portion is left unchanged into the Sn—Cu alloy layer, the strength of the metal wiring 14 can be maintained even if Cu is used as a metal wiring material. The semiconductor element 11, the resin film covering the surface of the semiconductor element 11, and the substrate have different thermal expansion coefficients. Therefore, when the temperature is varied in the process of hardening the resin film covering the surface of the semiconductor element 11 or the process of mounting the semiconductor device onto the substrate, stresses are generated due to such a difference in thermal expansion coefficient. Even if such stresses are generated, however, the above structure of the third embodiment can prevent the Sn—Cu alloy layer having low strength from being broken and thus can prevent disconnection of the metal wirings 14.

According to the third embodiment, the portion of the metal wiring 14 other than the external electrode portion (i.e., the non-electrode portion of the metal wiring 14) is covered with the insulating film 15. This prevents wirings or electrodes of the substrate on which the semiconductor device is mounted from contacting the non-electrode portions of the metal wirings 14 of the semiconductor device. The surface of the metal-material embedded portion 18A, that is, the exposed surface of the external electrode portion, is flush with or higher than the surface of the insulating film 15. In other words, the thickness of the external electrode portion (the total thickness of the metal-material embedded portion 18A and the metal wiring 14 located thereunder) is equal to or greater than that of the insulating film 15. Therefore, the following effects can be obtained: the ball electrode 16 can be mounted to the external electrode portion (the metal-material embedded portion 18A) without producing a gap therebetween. As a result, sufficient junction between the ball electrode 16 and the external electrode portion can be ensured.

In the third embodiment, the exposed surface of the external electrode portion (the surface of the metal-material embedded portion 18A) may be higher than the surface of the insulating film. In this case, a substantial thickness of a metal portion of the external electrode portion is increased. Accordingly, the following effects can be obtained: when Sn contained in solder of the ball electrode 16 diffuses into Cu contained in the metal-material embedded portion 18A or the metal wiring 14, a Sn—Cu alloy layer having low strength grows in the thickness direction of the external electrode portion. As described above, however, since the substantial thickness of the metal portion of the external electrode portion is increased, it is ensured that a greater part of the external electrode portion is left unchanged into the Sn—Cu alloy in the thickness direction of the external electrode portion. When the temperature is varied in a process such as the process of mounting the semiconductor device onto the substrate, stresses are generated due to the difference in thermal expansion coefficient between the semiconductor device and the substrate. However, the above structure of the third embodiment can more reliably prevent disconnection of the metal wirings 14 even if such stresses are generated. Note that, when the exposed surface of the external electrode portion (the surface of the metal-material embedded portion 18A) is higher than the surface of the insulating film 15, the external electrode portions may be bonded to the wiring electrodes of the substrate by solder without using the ball electrodes 16. In this case, the same effects as those described above can be obtained.

Note that, in the third embodiment, the material of the metal wirings 14 is not specifically limited. For example, a material mainly containing Cu, Ti, W, Cr, Al or the like may be used. Alternatively, another conductive metal material may be used. However, forming the metal wiring 14 from a Cu-containing metal enables reduction in resistance of the metal wiring 14.

In the third embodiment, the TiW layer and the Cu layer for forming the metal wirings 14 are sequentially formed by a sputtering method. However, the TiW layer and the Cu layer may alternatively be formed by a plating method, a screen printing method or the like.

In the third embodiment, the insulating film 15 is formed from a photosensitive material, and the opening pattern of the insulating film 15 is formed by a photolithography method capable of forming a fine pattern. However, the insulating film 15 may alternatively be formed from a non-photosensitive material, and the opening pattern of the insulating film 15 may alternatively be formed by a screen printing method or the like.

In the third embodiment, the metal film 18, that is, the metal-material embedded portions 18A, are formed from Ti and Cu. However, the metal film 18, that is, the metal-material embedded portions 18A, may alternatively be formed from a material mainly containing TiW, Cr, nickel (Ni), gold (Au) or the like. If the metal film 18 is formed by an electroplating method, the metal film 18, that is, the metal-material embedded portions 18A, may be formed from a material mainly containing Au, silver (Ag), palladium (Pd), lead (Pb), Ni or the like.

In the third embodiment, the surface of the metal-material embedded portions 18A is flush with or higher than the surface of the insulating film 15. In other words, the thickness of the external electrode portion (i.e., the total thickness of the metal-material embedded portion 18A and the metal wiring 14 located thereunder) is equal to or greater than the thickness of the insulating film 15. More specifically, the thickness of the external electrode portion is preferably in the range of 10 $\mu$m to 20 $\mu$m. If the thickness of the external electrode portion exceeds 20 $\mu$m, greater pattern deformation would be generated in the process of forming the metal-material embedded portions by a wet etching method.

In the third embodiment, the metal film 18 is formed by an electroplating method. However, the metal film 18 may alternatively be formed by an electroless plating method, a screen printing method or the like.

In the third embodiment, it is preferable to form an insulating resin layer on the passivation film 13 excluding the regions near the electrodes 12 before the metal wirings 14 are formed, and to form the metal wirings 14 along the surface of the insulating resin layer. In this case, the following effects can be obtained: when the temperature is varied to melt the ball electrodes 16 in the process of mounting the semiconductor device to the substrate, stresses are generated due to the difference in thermal expansion coefficient between the semiconductor device and the substrate. However, these stresses can be absorbed by the insulating resin layer. As a result, the stresses are reduced, whereby the external electrode portion of the metal wiring 14 to which the ball electrode 16 is connected can be prevented from being broken by the stresses.

(Fourth Embodiment)

Hereinafter, a method for manufacturing a semiconductor device according to the fourth embodiment of the present invention will be described with reference to the figures. Note that the manufacturing method of the fourth embodiment is a method for manufacturing the semiconductor device of the modification of the second embodiment.

Figure 9A:
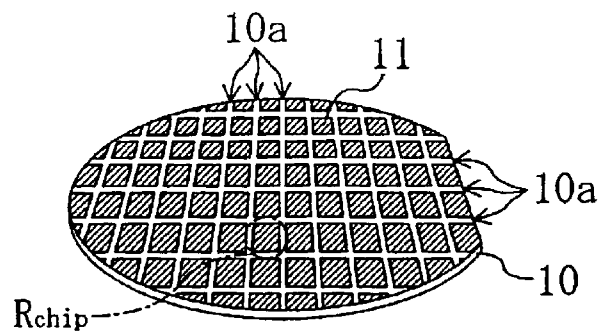
FIGS. 9A, 9B, 9C and 9D illustrate the steps of a method for manufacturing a semiconductor device according to a fourth embodiment of the present invention.
Figure 9B:
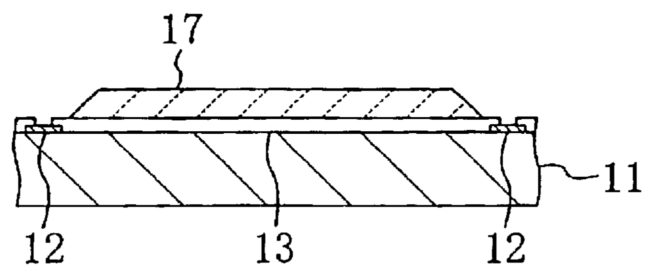
Figure 9C:
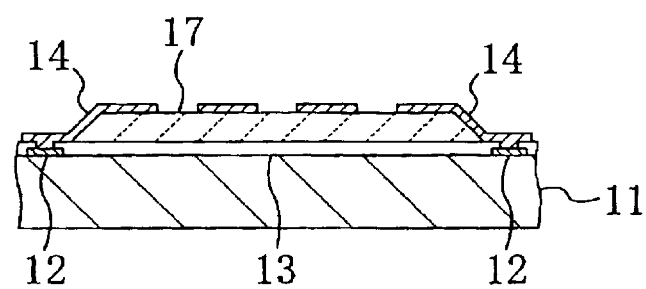
Figure 9D:
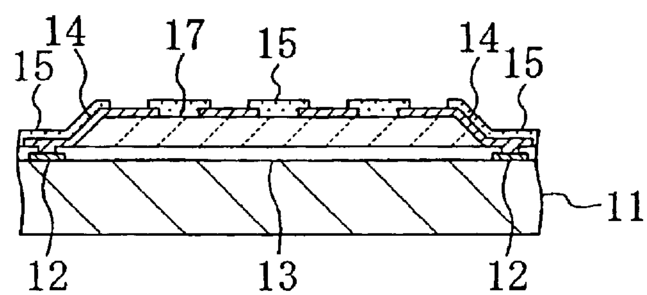
Figure 10A:
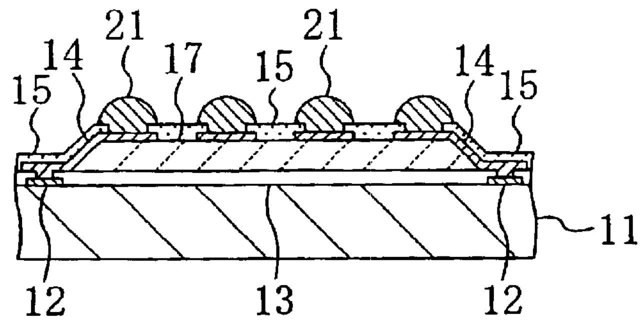
FIGS. 10A, 10B and 10C illustrate the steps of the method for manufacturing a semiconductor device according to the fourth embodiment of the present invention.
Figure 10B:
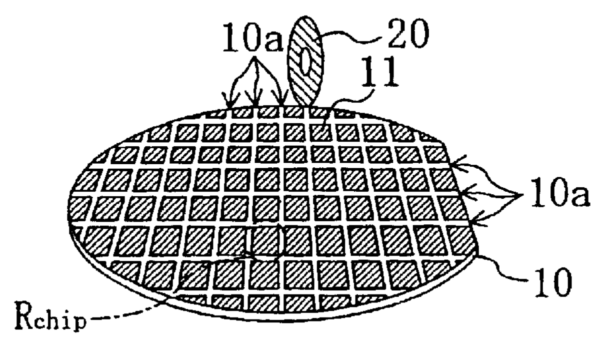

FIGS. 9A to 9D and FIGS. 10A to 10C illustrate the steps of the method for manufacturing a semiconductor device according to the fourth embodiment. FIGS. 9A and 10B are perspective views, and FIGS. 9B to 9D and FIGS. 10A, 10C are cross-sectional views. In the fourth embodiment, the same elements as those of the third embodiment in FIGS. 7A to 7E and FIGS. 8A, 8B are denoted with the same reference numerals and characters, and description thereof is partly omitted.

As shown in FIG. 9A, a semiconductor wafer 10 having a plurality of semiconductor elements 11 formed thereon is prepared. The semiconductor wafer 10 has a plurality of chip regions $R_{chip}$ defined by dicing lines 10*a*. Each semiconductor element 11 is provided in a corresponding one of the plurality of chip regions $R_{chip}$ of the semiconductor wafer 10. The following description will be given for the semiconductor element 11 provided in one of the plurality of chip regions $R_{chip}$.

As shown in FIG. 9B, a passivation film 13 is formed over the surface of the semiconductor element 11 having electrodes 12 formed thereon. For example, the passivation film 13 is formed from SiN. The passivation film 13 has an opening on each electrode 12. An insulating resin layer 17 is then formed on the passivation film 13 excluding the regions near the electrodes 12. For example, the insulating resin layer 17 is formed from an epoxy resin having low elasticity. In the present embodiment, the low-elasticity resin material of the insulating resin layer 17 is a photosensitive material. The insulating resin layer 17 having a desired pattern is formed by patterning a film of the photosensitive material by a photolithography method.

As shown in FIG. 9C, metal wirings 14 are formed along the surface of the insulating resin layer 17 so as to be electrically connected to the electrodes 12, respectively. For example, the metal wirings 14 have a thickness of 5 $\mu$m and are formed from Cu. More specifically, a Cu layer is formed on the insulating resin layer 17 by a sputtering method.

As shown in FIG. 9D, an insulating film 15 is formed on the passivation film 13, the insulating resin layer 17 and the metal wirings 14. Openings are then formed in the insulating film 15 so as to expose a predetermined region (external-electrode formation region) of each metal wiring 14. For example, the insulating film 15 is a resin film formed from solder resist or the like.

As shown in FIG. 10A, metal-material embedded portions 21 are formed in the openings of the insulating film 15 so as to be connected to the metal wirings 14, respectively. The thickness of the metal-material embedded portions 21 is greater than that of the insulating film 15. More specifically, the metal-material embedded portions 21 are formed from Cu, and formed by an electroless plating method. As a result, the top portions of the metal-material embedded portions 21 projecting from the surface of the insulating film 15 serve as projecting electrodes. The thickness of the external electrode portion (the total thickness of the metal-material embedded portion 21 and the metal wiring 14 located thereunder) is larger than that of the portion of the metal wiring 14 other than the external electrode portion (the non-electrode portion of the metal wiring 14).

Figure 10C:
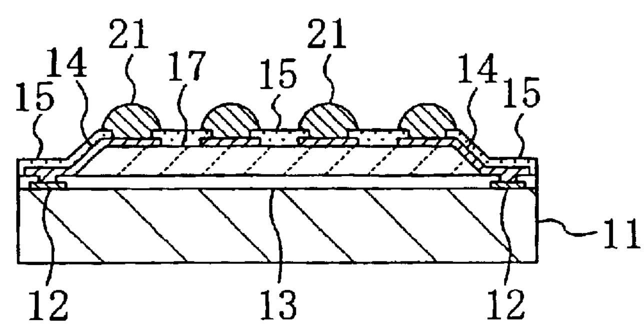

As shown in FIG. 10B, after the semiconductor elements 11 in the respective chip regions $R_{chip}$ of the semiconductor wafer 10 are subjected to the steps of FIGS. 9B to 9D and FIG. 10A, the semiconductor wafer 10 is diced along the dicing lines 10*a* by a rotating blade 20. As a result, individual chips of the semiconductor elements 11 are obtained as shown in FIG. 10C.

As has been described above, according to the fourth embodiment, the following effects can be obtained in addition to the effects of the third embodiment: when the temperature is varied to melt the ball electrodes in the process of mounting the semiconductor device to the substrate (the ball electrodes are mounted to the external electrode portions of the metal wirings 14, and each external electrode portion is formed by the metal-material embedded portion 21 and the metal wiring 14 located thereunder), stresses are generated due to the difference in thermal expansion coefficient between the semiconductor device and the substrate. However, these stresses can be absorbed by the insulating resin layer 17. As a result, the stresses are reduced, whereby the external electrode portion of the metal wiring 14 to which the ball electrode is connected can be prevented from being broken by the stresses.

According to the fourth embodiment, the portion of the metal wiring 14 other than the external electrode portion (i.e., the non-electrode portion of the metal wiring 14) is covered with the insulating film 15. This prevents wirings or electrodes of the substrate on which the semiconductor device is mounted from contacting the non-electrode portions of the metal wirings 14 of the semiconductor device. The surface of the metal-material embedded portion 21, that is, the exposed surface of the external electrode portion, is higher than the surface of the insulating film 15. In other words, the thickness of the external electrode portion is greater than that of the insulating film 15. Therefore, the following effects can be obtained: the ball electrode can be mounted to the external electrode portion (the metal-material embedded portion 21) without producing a gap therebetween. As a result, sufficient junction between the ball electrode and the external electrode portion can be ensured. Moreover, when Sn contained in solder of the ball electrode diffuses into Cu contained in the metal-material embedded portion 21 or the metal wiring 14, a Sn—Cu alloy layer having low strength grows in the thickness direction of the external electrode portion. According to the above structure of the fourth embodiment, however, it is ensured that a greater part of the external electrode portion is left unchanged into the Sn—Cu alloy in the thickness direction of the external electrode portion. When the temperature is varied in a process such as the process of mounting the semiconductor device onto the substrate, stresses are generated due to the difference in thermal expansion coefficient between the semiconductor device and the substrate. However, the above structure of the fourth embodiment can more reliably prevent disconnection of the metal wirings 14 even if such stresses are generated. Note that, when the exposed surface of the external electrode portion (the surface of the metal-material embedded portion 21) is higher than the surface of the insulating film 15, the external electrode portions may be bonded to the wiring electrodes of the substrate by solder without using the ball electrodes. In this case, the same effects as those described above can be obtained.

Note that, in the fourth embodiment, the material of the metal wirings 14 is not specifically limited. For example, a material mainly containing Cu, Ti, W, Cr, Al or the like may be used. Alternatively, another conductive metal material may be used. However, forming the metal wiring 14 from a Cu-containing metal enables reduction in resistance of the metal wiring 14.

In the fourth embodiment, the Cu layer for forming the metal wirings 14 is formed by a sputtering method. However, the Cu layer may alternatively be formed by a plating method, a screen printing method or the like.

In the fourth embodiment, the metal-material embedded portions 21 are formed from Cu. However, another metal material (e.g., a metal material used in another embodiment) may alternatively be used.

In the fourth embodiment, the metal-material embedded portions 21 are formed by an electroless plating method. However, the metal-material embedded portions 21 may alternatively be formed by, e.g., an electroplating method.

In the fourth embodiment, the surface of the metal-material embedded portions 21 is higher than the surface of the insulating film 15. However, the surface of the metal-material embedded portions 21 may alternatively be flush with the surface of the insulating film 15. In this case, a semiconductor device having the same structure as that of the semiconductor device of the second embodiment is obtained. Note that the thickness of the external electrode portion (the total thickness of the metal-material embedded portion 21 and the metal wiring 14 located thereunder) is preferably in the range of 10 μm to 20 μm.

(Fifth Embodiment)

Hereinafter, a method for manufacturing a semiconductor device according to the fifth embodiment of the present invention will be described with reference to the figures note that, like the third embodiment, the manufacturing method of the fifth embodiment is a method for manufacturing the semiconductor device of the first embodiment.

Figure 11A:
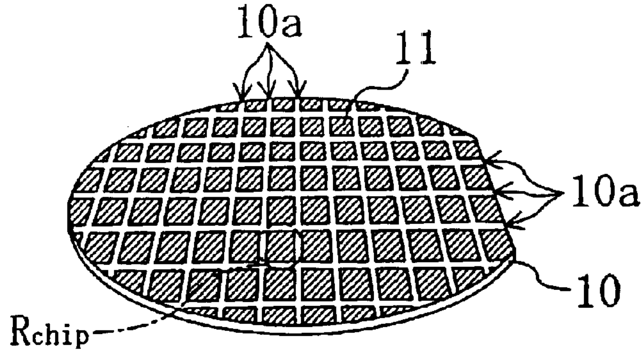
FIGS. 11A, 11B, 11C, 11D and 11E illustrate the steps of a method for manufacturing a semiconductor device according to a fifth embodiment of the present invention.
Figure 11B:
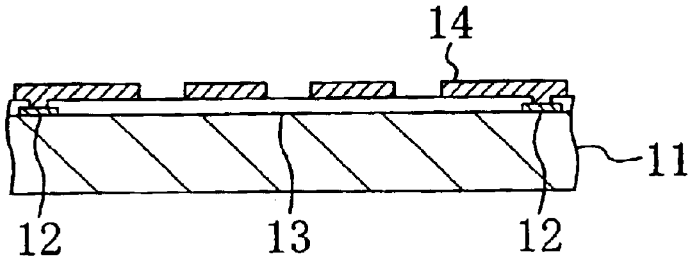
Figure 11C:
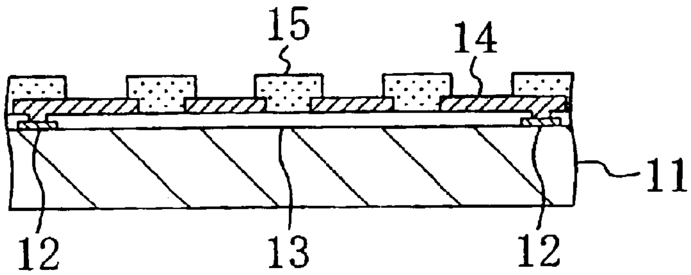
Figure 11D:
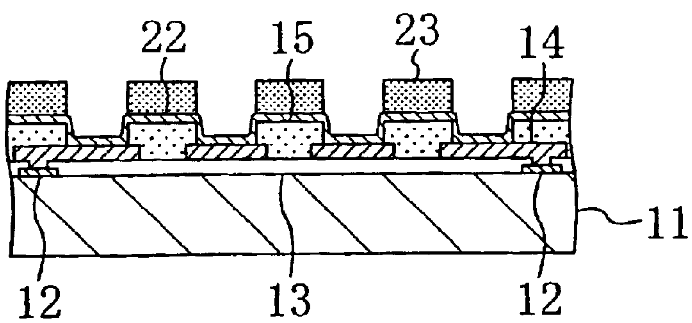
Figure 11E:
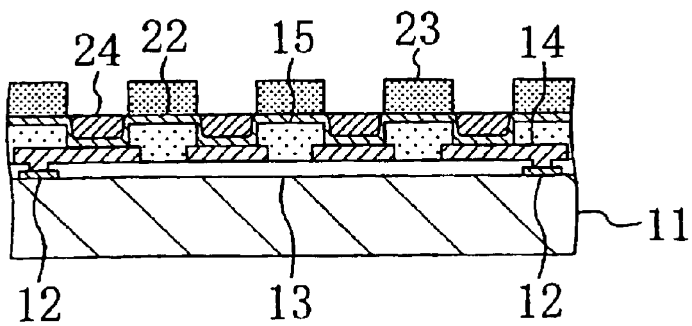
Figure 12A:
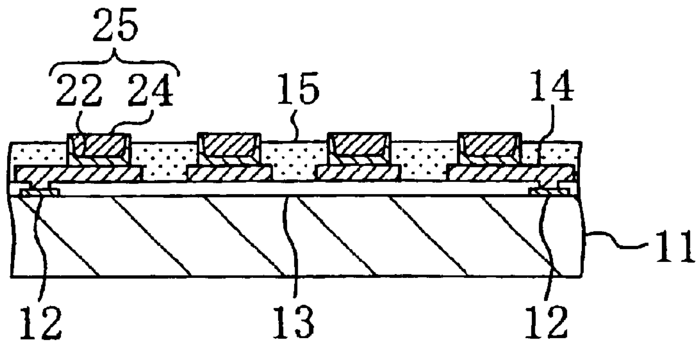
FIGS. 12A, 12B and 12C illustrate the steps of the method for manufacturing a semiconductor device according to the fifth embodiment of the present invention.
Figure 12B:
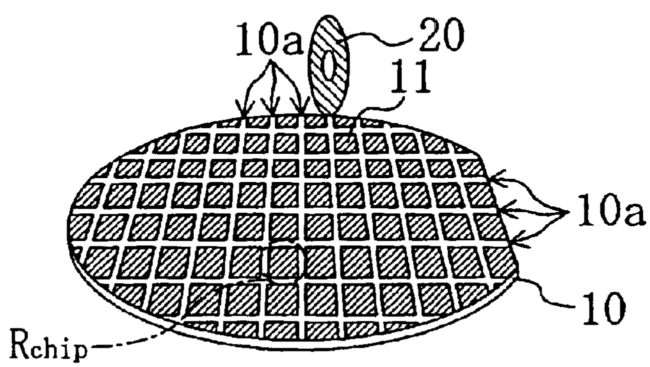

FIGS. 11A to 11E and FIGS. 12A to 12C illustrate the steps of the method for manufacturing a semiconductor device according to the fifth embodiment. FIGS. 11A and 12B are perspective views, and FIGS. 11B to 11E and FIGS. 12A, 12C are cross-sectional views. In the fifth embodiment, the same elements as those of the semiconductor device of the third embodiment in FIGS. 7A to 7E and FIGS. 8A, 8B are denoted with the same reference numerals and characters.

As shown in FIG. 11A, a semiconductor wafer 10 having a plurality of semiconductor elements 11 formed thereon is prepared. The semiconductor wafer 10 has a plurality of chip regions $R_{chip}$ defined by dicing lines 10*a*. Each semiconductor element 11 is provided in a corresponding one of the plurality of chip regions $R_{chip}$ of the semiconductor wafer 10. The following description will be given for the semiconductor element 11 provided in one of the plurality of chip regions $R_{chip}$.

As shown in FIG. 11B, a passivation film 13 is formed over the surface of the semiconductor element 11 having electrodes 12 formed thereon. For example, the passivation film 13 is formed from SiN. The passivation film 13 has an opening on each electrode 12. Metal wirings 14 containing, e.g., Cu are then formed on the passivation film 13 so as to be electrically connected to the electrodes 12, respectively. More specifically, the metal wirings 14 are formed as follows: a TiW layer and a Cu layer are sequentially formed on the passivation film 13 by a sputtering method. The TiW layer and the Cu layer are then etched by using a mask which covers the regions where the metal wirings are to be formed (i.e., the metal-wiring formation regions). The mask is formed from a photoresist material. The metal wirings 14 having a desired pattern are thus formed. The resist mask is then removed.

As shown in FIG. 11C, an insulating film 15 is formed on the passivation film 13 and the metal wirings 14. Openings are then formed in the insulating film 15 so as to expose a predetermined region of each metal wiring 14 (a region where an external electrode is to be formed, i.e., an external-electrode formation region). For example, the insulating film 15 is a resin film having a thickness of 12 μm, and is formed from solder resist or the like. In the present embodiment, the insulating film 15 is formed from a photosensitive material. Therefore, the opening pattern of the insulating film 15 is formed by using a photolithography method capable of forming a fine pattern.

As shown in FIG. 11D, a first metal film 22 containing, e.g., Cu is formed on the insulating film 15 so that each opening of the insulating film 15 is partially filled with the first metal film 22. More specifically, the first metal film 22 is formed by sequentially forming a TiW layer and a Cu layer on the insulating film 15 by a sputtering method. Thereafter, a resist mask 23 is formed so as to cover the region of the insulating film 15 located outside the openings. In other words, the resist mask 23 is formed so as to expose the openings of the insulating film 15.

As shown in FIG. 11E, a second metal film 24 is formed on the exposed regions of the first metal film 22 by, e.g., an electroplating method so as to completely fill the openings of the insulating film 15. The exposed regions of the first metal film 22 are the regions of the first metal film 22 located within the openings of the insulating film 15 and surrounded by the resist mask 23. For example, the second metal film 24 is formed from Cu.

As shown in FIG. 12A, the resist mask 23 is removed, and the portion of the first metal film 22 located outside the openings of the insulating film 15 are removed by an etching method. As a result, metal-material embedded portions 25 are formed by the first and second metal films 22, 24 embedded in the openings of the insulating film 15. Note that the surface of the metal-material embedded portions 25 is flush with or higher than the surface of the insulating film 15. In other words, the thickness of the external electrode portion (the total thickness of the metal-material embedded portion 25 and the metal wiring 14 located thereunder) is equal to or greater than that of the insulating film 15. As a result, the thickness of the external electrode portion is greater than the thickness of the portion of the metal wiring 14 other than the external electrode portion (i.e., the non-electrode portion of the metal wiring 14).

Figure 12C:
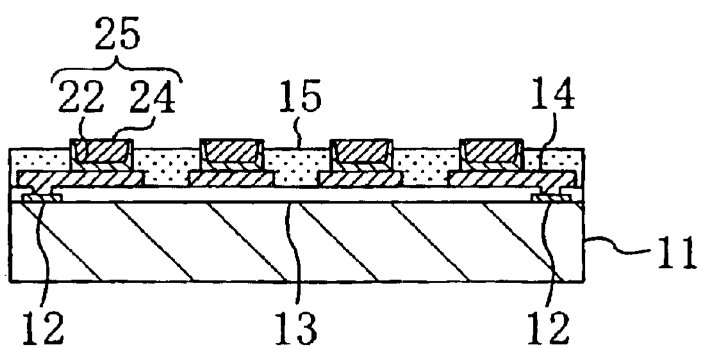

As shown in FIG. 12B, after the semiconductor elements 11 in the respective chip regions $R_{chip}$ of the semiconductor wafer 10 are subjected to the steps of FIGS. 11B to 11E and FIG. 12A, the semiconductor wafer 10 is diced along the dicing lines 10*a* by a rotating blade 20. As a result, individual chips of the semiconductor elements 11 are obtained as shown in FIG. 12C.

As has been described above, according to the fifth embodiment, the metal wirings 14 are formed so as to be electrically connected to the electrodes 12 of the semiconductor element 11, respectively. The insulating film 15 is then formed, and openings are formed in the insulating film 15 so as to expose the external-electrode formation regions of the metal wirings 14. Thereafter, the metal-material embedded portions 25 are embedded in the respective openings so that the surface of the metal-material embedded portions 25 is flush with or higher than the surface of the insulating film 15. Accordingly, the thickness of the external electrode portion (i.e., the total thickness of the metal-material embedded portion 25 embedded in the opening of the insulating film 15 and the metal wiring 14 located under the metal-material embedded portion 25) is greater than the thickness of the portion of the metal wiring 14 other than the external electrode portion (i.e., the non-electrode portion of the metal wiring 14). As a result, the same effects as those of the manufacturing method of the third embodiment can be obtained.

According to the fifth embodiment, the portion of the metal wiring 14 other than the external electrode portion (i.e., the non-electrode portion of the metal wiring 14) is covered with the insulating film 15. This prevents wirings or electrodes of a substrate on which the semiconductor device is mounted from contacting the non-electrode portions of the metal wirings 14 of the semiconductor device. The surface of the metal-material embedded portion 25, that is, the exposed surface of the external electrode portion, is flush with or higher than the surface of the insulating film 15. In other words, the thickness of the external electrode portion (the total thickness of the metal-material embedded portion 25 and the metal wiring 14 located thereunder) is equal to or greater than that of the insulating film 15. Therefore, the following effects can be obtained: a ball electrode can be mounted to the external electrode portion (the metal-material embedded portion 25) without producing a gap therebetween. As a result, sufficient junction between the ball electrode and the external electrode portion can be ensured.

In the fifth embodiment, the exposed surface of the external electrode portion (the surface of the metal-material embedded portion 25) may be higher than the surface of the insulating film. In this case, a substantial thickness of a metal portion of the external electrode portion is increased. Accordingly, the following effects can be obtained: when Sn contained in solder of the ball electrode diffuses into Cu contained in the metal-material embedded portion 25 or the metal wiring 14, a Sn—Cu alloy layer having low strength grows in the thickness direction of the external electrode portion. As described above, however, since the substantial thickness of the metal portion of the external electrode portion is increased, it is ensured that a greater part of the external electrode portion is left unchanged into the Sn—Cu alloy in the thickness direction of the external electrode portion. When the temperature is varied in a process such as the process of mounting the semiconductor device onto the substrate, stresses are generated due to the difference in thermal expansion coefficient between the semiconductor device and the substrate. However, the above structure of the fifth embodiment can more reliably prevent disconnection of the metal wirings 14 even if such stresses are generated. Note that, when the exposed surface of the external electrode portion (the surface of the metal-material embedded portion 25) is higher than the surface of the insulating film 15, the external electrode portions may be bonded to the wiring electrodes of the substrate by solder without using the ball electrodes. In this case, the same effects as those described above can be obtained.

Note that, in the fifth embodiment, the material of the metal wirings 14 is not specifically limited. For example, a material mainly containing Cu, Ti, W, Cr, Al or the like may be used. Alternatively, another conductive metal material may be used. However, forming the metal wiring 14 from a Cu-containing metal enables reduction in resistance of the metal wiring 14.

In the fifth embodiment, the TiW layer and the Cu layer for forming the metal wirings 14 are sequentially formed by a sputtering method. However, the TiW layer and the Cu layer may alternatively be formed by a plating method, a screen printing method or the like.

In the fifth embodiment, the insulating film 15 is formed from a photosensitive material, and the opening pattern of the insulating film 15 is formed by a photolithography method capable of forming a fine pattern. However, the insulating film 15 may alternatively be formed from a non-photosensitive material, and the opening pattern of the insulating film 15 may alternatively be formed by a screen printing method or the like.

In the fifth embodiment, the material of the first metal film 22 is not specifically limited. For example, a material mainly containing Cu, Ti, W, Cr, Al or the like may be used. Alternatively, another conductive metal material may be used.

In the fifth embodiment, the TiW layer and the Cu layer for forming the first metal film 22 are sequentially formed by a sputtering method. However, the TiW layer and the Cu layer may alternatively be formed by a plating method, a screen printing method or the like.

In the fifth embodiment, the second metal film 24 is formed from Cu. However, the second metal film 24 may alternatively be formed from a material mainly containing Ni, Ag, Au, Sn, Pd or the like.

In the fifth embodiment, the metal-material embedded portion 25 having its top portion larger than the opening of the insulating film 15 may be formed by a screen printing method or the like so that the top portion of the metal-material embedded portion 25 projecting from the surface of the insulating film 15 serves as a mushroom-like projecting electrode. In this case, a semiconductor device having the same structure as that of the semiconductor device of the modification of the first embodiment is formed. In the fifth embodiment, the second metal film 24 is formed by an electroplating method. However, the second metal film 24 may alternatively be formed by an electroless plating method, a screen printing method or the like.

In the fifth embodiment, the surface of the metal-material embedded portions 25 is flush with or higher than the surface of the insulating film 15. In other words, the thickness of the external electrode portion (i.e., the total thickness of the metal-material embedded portion 25 and the metal wiring 14 located thereunder) is equal to or greater than the thickness of the insulating film 15. More specifically, the thickness of the external electrode portion is preferably in the range of 10 μm to 20 μm. If the thickness of the external electrode portion exceeds 20 μm, it is difficult to form the resist mask 23 having a sufficient thickness (see FIG. 11D) near the openings (i.e., stepped portions) of the insulating film 15.

In the fifth embodiment, it is preferable to form an insulating resin layer on the passivation film 13 excluding the regions near the electrodes 12 before the metal wirings 14 are formed, and to form the metal wirings 14 along the surface of the insulating resin layer. In this case, the following effects can be obtained: when the temperature is varied to melt the ball electrodes in the process of mounting the semiconductor device to the substrate, stresses are generated due to the difference in thermal expansion coefficient between the semiconductor device and the substrate. However, these stresses can be absorbed by the insulating resin layer. As a result, the stresses are reduced, whereby the external electrode portion of the metal wiring 14 to which the ball electrode is connected can be prevented from being broken by the stresses.

(Sixth Embodiment)

Hereinafter, a method for manufacturing a semiconductor device according to the sixth embodiment of the present invention will be described with reference to the figures.

Figure 13A:
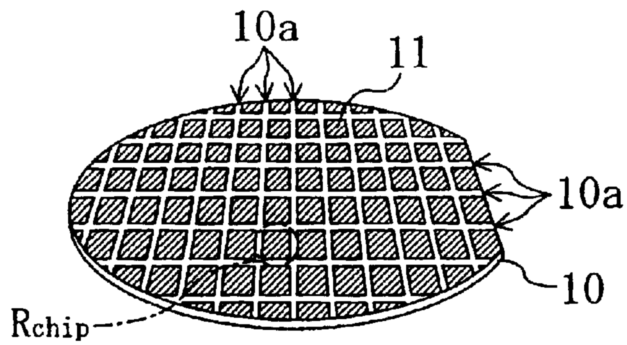
FIGS. 13A, 13B, 13C and 13D illustrate the steps of a method for manufacturing a semiconductor device according to a sixth embodiment of the present invention.
Figure 13B:
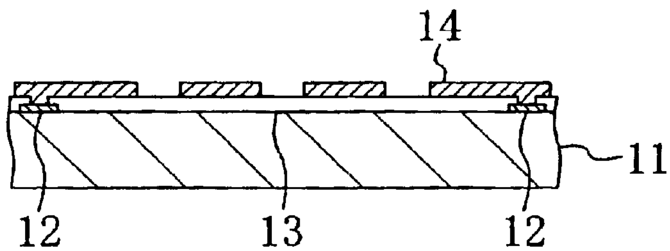
Figure 13C:
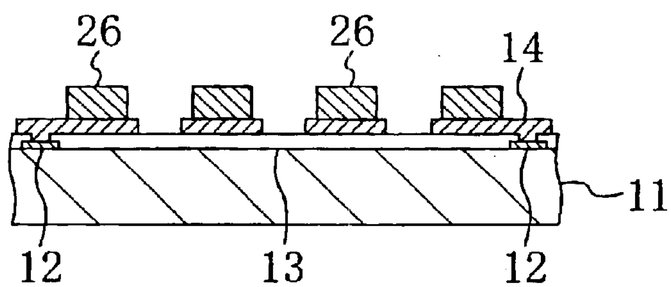
Figure 13D:
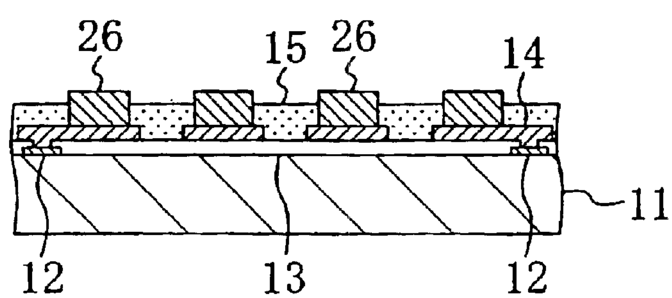
Figure 14A:
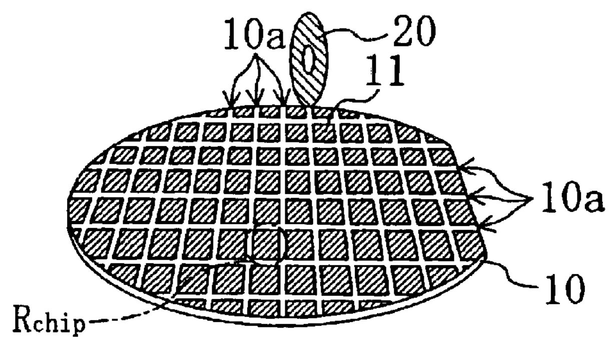
FIGS. 14A and 14B illustrate the steps of the method for manufacturing a semiconductor device according to the sixth embodiment of the present invention.

FIGS. 13A to 13D and FIGS. 14A, 14B illustrate the steps of the method for manufacturing a semiconductor device according to the sixth embodiment. FIGS. 13A and 14A are perspective views, and FIGS. 13B to 13D and FIG. 14B are cross-sectional views. In the sixth embodiment, the same elements as those of the third embodiment in FIGS. 7A to 7E and FIGS. 8A, 8B are denoted with the same reference numerals and characters.

As shown in FIG. 13A, a semiconductor wafer 10 having a plurality of semiconductor elements 11 formed thereon is prepared. The semiconductor wafer 10 has a plurality of chip regions $R_{chip}$ defined by dicing lines 10a. Each semiconductor element 11 is provided in a corresponding one of the plurality of chip regions $R_{chip}$ of the semiconductor wafer 10. The following description will be given for the semiconductor element 11 provided in one of the plurality of chip regions $R_{chip}$.

As shown in FIG. 13B, a passivation film 13 is formed over the surface of the semiconductor element 11 having electrodes 12 formed thereon. For example, the passivation film 13 is formed from SiN. The passivation film 13 has an opening on each electrode 12. Metal wirings 14 containing, e.g., Cu are then formed on the passivation film 13 so as to be electrically connected to the electrodes 12, respectively. More specifically, the metal wirings 14 are formed as follows: a TiW layer and a Cu layer are sequentially formed on the passivation film 13 by a sputtering method. The TiW layer and the Cu layer are then etched by using a mask which covers the regions where the metal wirings are to be formed (i.e., the metal-wiring formation regions). The mask is formed from a photoresist material. The metal wirings 14 having a desired pattern are thus formed. The resist mask is then removed.

As shown in FIG. 13C, projecting electrodes 26 having a thickness of about 20 μm are formed as follows: conductive resin paste is applied with a desired pattern to a predetermined region of each metal wiring 14 (a region where an external electrode is to be formed, i.e., an external-electrode formation region) by a screen printing method or the like. For example, powdered Ag added to a thermosetting epoxy resin is used as the resin paste.

As shown in FIG. 13D, an insulating film 15 having a thickness of about 15 μm is formed on the passivation film 13 and the metal wirings 14 (i.e., over the surface of the semiconductor wafer 10). As a result, the top portions of the projecting electrodes 26 are exposed from the surface of the insulating film 15. For example, the insulating film 15 is a resin film formed from solder resist or the like, and is formed by a spin coating method or the like.

Note that, in the present embodiment, the top portions of the projecting electrodes 26 may be cleaned by etching the surface of the semiconductor wafer 10 by a dry etching method using oxygen gas after the insulating film 15 is formed. This improves conductivity between the projecting electrodes 26 of the semiconductor device and the wiring electrodes of a substrate on which the semiconductor device is mounted.

Figure 14B:
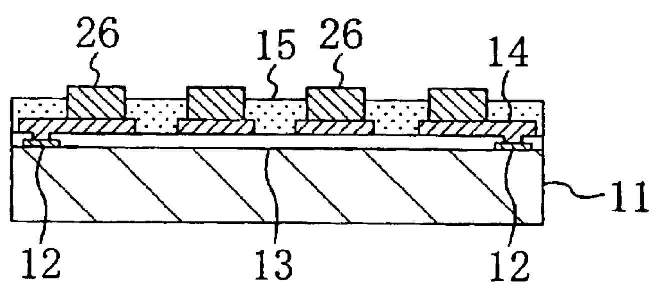
Figure 15A:
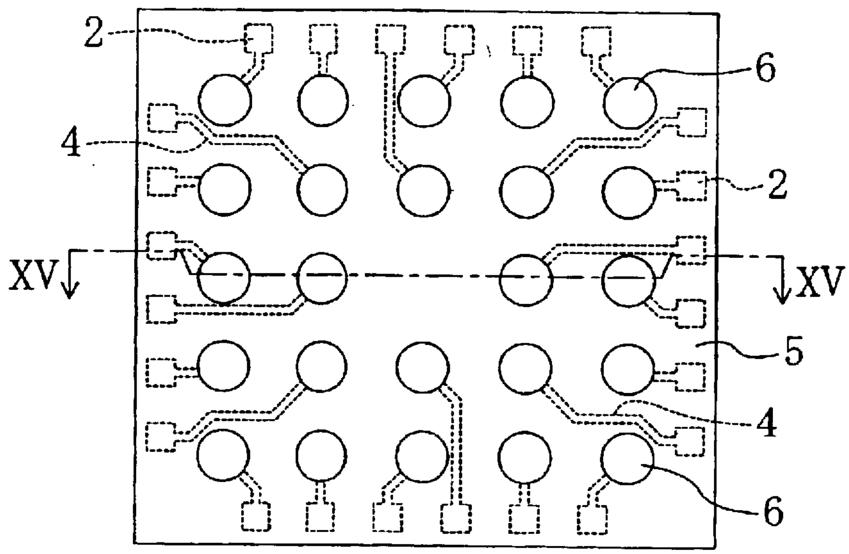
FIG. 15A is a perspective plan view of a conventional semiconductor device.
Figure 15B:
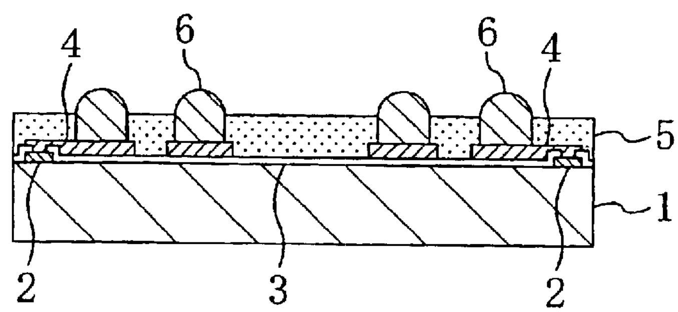
FIG. 15B shows an example of the cross-sectional structure taken along line XV—XV of FIG. 15A.
Figure 15C:
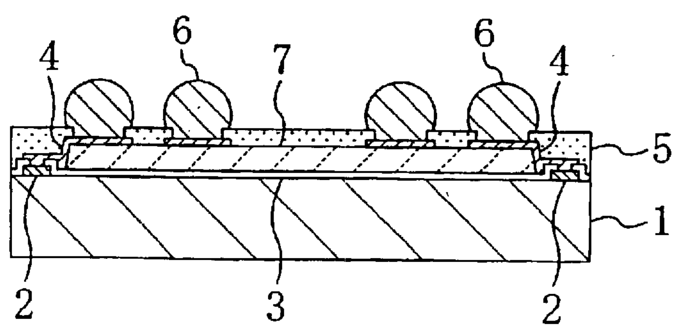
FIG. 15C shows another example of the cross-sectional structure taken along line XV—XV of FIG. 15A.

As shown in FIG. 14A, after the semiconductor elements 11 in the respective chip regions $R_{chip}$ of the semiconductor wafer 10 are subjected to the steps of FIGS. 13B to 13D, the semiconductor wafer 10 is diced along the dicing lines 10a by a rotating blade 20. As a result, individual chips of the semiconductor elements 11 are obtained as shown in FIG. 14B.

As has been described above, according to the sixth embodiment, the metal wirings 14 are formed so as to be electrically connected to the electrodes 12 of the semiconductor element 11, respectively. Thereafter, the projecting electrodes 26 are respectively formed on the external-electrode formation regions of the metal wirings 14, and the insulating film 15 is then formed so as to expose the top portions of the projecting electrodes 26. Accordingly, the thickness of the external electrode portion (i.e., the total thickness of the projecting electrode 26 and the metal wiring 14 located thereunder) is greater than the thickness of the portion of the metal wiring 14 other than the external electrode portion (i.e., the non-electrode portion of the metal wiring 14). As a result, the same effects as those of the semiconductor device of the third embodiment can be obtained.

According to the sixth embodiment, the portion of the metal wiring 14 other than the external electrode portion (i.e., the non-electrode portion of the metal wiring 14) is covered with the insulating film 15. This prevents wirings or electrodes of the substrate on which the semiconductor device is mounted from contacting the non-electrode portions of the metal wirings 14 of the semiconductor device. The surface of the projecting electrode 26, that is, the exposed surface of the external electrode portion, is higher than the surface of the insulating film 15. In other words, the thickness of the external electrode portion is greater than that of the insulating film 15. Therefore, the following effects can be obtained: a ball electrode can be mounted to the external electrode portion (the projecting electrode 26) without producing a gap therebetween. As a result, sufficient junction between the ball electrode and the external electrode portion can be ensured. Moreover, when Sn contained in solder of the ball electrode diffuses into Cu contained in the projecting electrode 26 or the metal wiring 14, a Sn—Cu alloy layer having low strength grows in the thickness direction of the external electrode portion. According to the above structure of the sixth embodiment, however, it is ensured that a greater part of the external electrode portion is left unchanged into the Sn—Cu alloy in the thickness direction of the external electrode portion. When the temperature is varied in a process such as the process of mounting the semiconductor device onto the substrate, stresses are generated due to the difference in thermal expansion coefficient between the semiconductor device and the substrate. However, the above structure of the sixth embodiment can more reliably prevent disconnection of the metal wirings 14 even if such stresses are generated. Note that, when the exposed surface of the external electrode portion (the surface of the projecting electrode 26) is higher than the surface of the insulating film 15, the external electrode portions may be bonded to the wiring electrodes of the substrate by solder without using the ball electrodes. In this case, the same effects as those described above can be obtained.

Note that, in the sixth embodiment, the material of the metal wirings 14 is not specifically limited. For example, a material mainly containing Cu, Ti, W, Cr, Al or the like may be used. Alternatively, another conductive metal material may be used. However, forming the metal wiring 14 from a Cu-containing metal enables reduction in resistance of the metal wiring 14.

In the sixth embodiment, the TiW layer and the Cu layer for forming the metal wirings 14 are sequentially formed by a sputtering method. However, the TiW layer and the Cu layer may alternatively be formed by a plating method, a screen printing method or the like.

In the sixth embodiment, a conductive component of the resin paste for forming the projecting electrodes 26 is not specifically limited. For example, Ni, Cu, Au, Ag, Sn, Pd or the like may be used as the conductive component.

In the sixth embodiment, the insulating film 15 is formed by a spin coating method. However, the insulating film 15 may alternatively be formed by a curtain coating method.

In the sixth embodiment, it is preferable to form an insulating resin layer on the passivation film 13 excluding the regions near the electrodes 12 before the metal wirings 14 are formed, and to form the metal wirings 14 along the surface of the insulating resin layer. In this case, the following effects can be obtained: when the temperature is varied to melt the ball electrodes in the process of mounting the semiconductor device to the substrate, stresses are generated due to the difference in thermal expansion coefficient between the semiconductor device and the substrate. However, these stresses can be absorbed by the insulating resin layer. As a result, the stresses are reduced, whereby the external electrode portion of the metal wiring 14 to which the ball electrode is connected can be prevented from being broken by the stresses.

What is claimed is:

1. A semiconductor device, comprising:
- a semiconductor element;
- a first electrode portion formed on the semiconductor element, said first electrode portion comprising a first metal component;
- a second electrode portion formed on the semiconductor element and electrically connected to said first electrode portion, said second electrode portion comprising a second metal component different from said first metal component; and
- a diffusion layer formed between said first electrode portion and said second electrode portion,
- wherein said diffusion layer comprises said first metal component and said second metal component.

2. The semiconductor device of claim 1, wherein said first metal component includes copper and said second metal component includes tin.

3. The semiconductor device of claim 1, further comprising a third electrode portion formed on a surface of the semiconductor element and a metal wiring formed on the semiconductor element, said metal wiring electrically connecting the first electrode portion to the third electrode portion.

4. The semiconductor device of claim 3, wherein the first and third electrode portion are horizontally spaced apart with respect to the semiconductor element.

5. The semiconductor device of claim 3, further comprising an insulating film formed on said metal wiring,
- wherein an opening of said insulating film exposes a surface of the first electrode portion, and
- wherein said surface of the first electrode portion is flush with or higher than a surface of the insulating film.

6. The semiconductor device of claim 3, wherein the metal wiring includes copper.

7. The semiconductor device of claim 3, further comprising an insulating resin layer formed between the surface of the semiconductor element and the metal wiring,
- wherein the metal wiring is formed along a surface of the insulating resin layer.

8. The semiconductor device of claim 3, wherein the metal wiring has a thickness in the range of 0.01 μm to 8 μm.

9. The semiconductor device of claim 1, further comprising a substrate having a wiring electrode,
- wherein said wiring electrode is electrically connected to said second electrode portion.

10. A semiconductor device comprising:
- a semiconductor element;
- a first electrode portion formed on the semiconductor element, said first electrode portion comprising a first metal component;
- a second electrode portion formed on the semiconductor element and electrically connected to said first electrode portion, said second electrode portion comprising a second metal component different from said first metal component; and a diffusion layer formed between said first electrode portion and said second electrode portion, wherein said diffusion layer comprises said first metal component and said second metal component, and said first electrode portion and said diffusion layer have a combined thickness in the range of 10 μm to 20 m.

11. The semiconductor device of claim 10, wherein said first metal component includes copper and said second metal component includes tin.

12. The semiconductor device of claim 10, further comprising a third electrode portion formed on a surface of the semiconductor element and a metal wiring formed on the semiconductor element, said metal wiring electrically connecting the first electrode portion to the third electrode portion.

13. The semiconductor device of claim 12, wherein the first electrode portion and the third electrode portion are horizontally spaced apart with respect to the semiconductor element.

14. The semiconductor device of claim 12, further comprising an insulating film formed on said metal wiring, wherein an opening of said insulating film exposes a surface of the first electrode portion, and wherein said surface of the first electrode portion is flush with or higher than a surface of the insulating film.

15. The semiconductor device of claim 12, wherein the metal wiring includes copper.

16. The semiconductor device of claim 12, further comprising an insulating resin layer formed between the surface of the semiconductor element and the metal wiring, wherein the metal wiring is formed along a surface of the insulating resin layer.

17. The semiconductor device of claim 12, wherein the metal wiring has a thickness in the range of 0.01 μm to 8 μm.

18. The semiconductor device of claim 10, further comprising a substrate having a wiring electrode, wherein said wiring electrode is electrically connected to said second electrode portion.

* * * * *

UNITED STATES PATENT AND TRADEMARK OFFICE

CERTIFICATE OF CORRECTION

PATENT NO. : 6,954,001 B2
APPLICATION NO. : 10/919402
DATED : October 11, 2005
INVENTOR(S) : Yoshifumi Nakamura et al.

It is certified that error appears in the above-identified patent and that said Letters Patent is hereby corrected as shown below:

In the Claims, In Claim 10, Line 16,

Add --μ-- immediately before "m." such that the claim recites "20 μm."

Signed and Sealed this
Third Day of May, 2016

Michelle K. Lee

Michelle K. Lee
*Director of the United States Patent and Trademark Office*